(12) United States Patent
Saito

(10) Patent No.: US 7,400,161 B2
(45) Date of Patent: Jul. 15, 2008

(54) ELECTRONIC DEVICE TEST SYSTEM

(75) Inventor: Noboru Saito, Tokyo (JP)

(73) Assignee: Advantest Corporation, Tokyo (JP)

( * ) Notice: Subject to any disclaimer, the term of this patent is extended or adjusted under 35 U.S.C. 154(b) by 135 days.

(21) Appl. No.: 10/522,548

(22) PCT Filed: Jul. 30, 2002

(86) PCT No.: PCT/JP02/07722

§ 371 (c)(1),
(2), (4) Date: Jan. 27, 2005

(87) PCT Pub. No.: WO2004/011952

PCT Pub. Date: Feb. 5, 2004

(65) Prior Publication Data

US 2006/0181265 A1      Aug. 17, 2006

(51) Int. Cl.
*G01R 31/26* (2006.01)
(52) U.S. Cl. .................................... 324/765
(58) Field of Classification Search .............. None
See application file for complete search history.

(56) References Cited

U.S. PATENT DOCUMENTS

| | | |
|---|---|---|
| 5,227,717 A | 7/1993 | Tsurishima et al. |
| 5,894,217 A | 4/1999 | Igarashi et al. |
| 6,304,073 B1 | 10/2001 | Saito et al. |
| 6,456,062 B2 * | 9/2002 | Yamashita et al. ....... 324/158.1 |
| 6,919,734 B2 * | 7/2005 | Saito et al. ................... 324/760 |
| 7,049,841 B2 * | 5/2006 | Yamashita ................... 324/760 |
| 7,119,531 B2 * | 10/2006 | Sakata ...................... 324/158.1 |

FOREIGN PATENT DOCUMENTS

| | | |
|---|---|---|
| DE | 19616809 A1 | 10/1996 |
| DE | 19928524 A1 | 12/1999 |
| DE | 10129706 A1 | 1/2002 |
| JP | 2000-9798 A | 1/2000 |
| JP | 2000-187060 A | 7/2000 |
| JP | 2000-187080 | 7/2000 |
| JP | 2000-206187 A | 7/2000 |

* cited by examiner

*Primary Examiner*—Ha Nguyen
*Assistant Examiner*—Trung Q. Nguyen
(74) *Attorney, Agent, or Firm*—Birch, Stewart, Kolasch & Birch, LLP

(57) ABSTRACT

An electronic device testing apparatus for conducting a test by pressing input/output terminals of an IC to be tested against sockets (50), comprising a pusher (30) provided at least with a pusher base (34) provided to be able to approach and separate with respect to said sockets (50), a lead pusher base (35) fixed to said pusher base (34), a pusher block (31) for pressing against said sockets (50) by contacting said IC to be tested from an opposite face of said socket (50), a load base (32) attached with the pusher block (31), and two springs (36, 38) for giving an elastic force in the direction of pressing the IC to be tested to the pusher block (31) via the load base (32), wherein the load base (32) and the springs (36, 38) are sandwiched with the lead pusher base (35) and the pusher base (34), and the pusher block (31) is detachably attached to the load base (32) via an opening portion provided to the pusher base (34).

27 Claims, 14 Drawing Sheets

ELECTRONIC DEVICE TEST SYSTEM

TECHNICAL FIELD

The present invention relates to an electronic device testing apparatus for conducting tests on semiconductor integrated circuit elements and a variety of other electronic devices (hereinafter, also representatively referred to as ICs), and particularly relates to an electronic device testing apparatus capable of applying a suitable pressure force to any electronic devices at the time of the tests.

BACKGOUND ART

In an IC testing apparatus (electronic device testing apparatus) called a handler, a large number of ICs to be tested held on a tray are conveyed into the handler, and the respective ICs to be tested are brought to electrically contact a test head for conducting a test by an electronic device testing apparatus body (hereinafter, also referred to as a tester). When the test is finished, the ICs are taken out from the test head and reloaded to trays in accordance with the test results so as to be classified to categories of good ones and defective ones, etc.

In conventional electronic device testing apparatuses, there is a type wherein a tray for holding pre-test ICs or post-tested ICs (hereinafter, also referred to as a customer tray) differs from a tray conveyed by circulating inside the electronic device testing apparatus (hereinafter, also referred to as a test tray). In an electronic device testing apparatus of this kind, ICs are reloaded between the customer tray and the test tray before and after the test, and the ICs are pressed against a test head in a state of being carried on the test tray in a test step for conducting a test by bringing the ICs to contact the test head.

Conventionally, in a test step of the electronic device testing apparatus, an IC to be tested is pressed against contact pins as a result that a pressing mechanism called a pusher lowers, but the number of input/output terminals introduced from a package of the IC to be tested differs, for example from 40 to 130, and a length of the terminal and a shape of the package, etc. are also different between respective kinds, so that a suitable pressing force required by kinds of ICs to be tested is different. Accordingly, to deal with all kinds of ICs to be tested in the electronic device testing apparatus, pushers for the number of kinds capable of applying suitable pressing forces have to be prepared and every time a kind of ICs to be tested is changed, all of the pushers have to be exchanged to those corresponding to the kind.

DISCLOSURE OF THE INVENTION

The present invention relates to an electronic device testing apparatus for conducting tests on electronic devices, and particularly relates to an electronic device testing apparatus capable of applying a suitable pressure force to any electronic devices at the time of tests.

To attain the above object, according to the present invention, there is provided an electronic device testing apparatus for conducting a test by pressing input/output terminals of an electronic device to be tested against a socket of a test head, comprising a pusher provided at least with a pusher base provided to be able to approach and separate with respect to said socket, a lead pusher base fixed to said pusher base, a pusher block provided movably to said pusher base for pressing against said socket by contacting said electronic device to be tested from an opposite face of said socket at the time of said test, and two or more elastic means provided between said lead pusher base and said pusher block having an elastic force in the direction of pressing said electronic device to be tested, and wherein an elastic force from at least one elastic means among said two or more elastic means acts on said pusher block at the time of said test (refer to claim 1).

As a result that a pusher is provided with two or more elastic means having an elastic force in the direction of pressing an electronic device to be tested, a range of an elastic force obtained by the elastic means of the pusher can be made wide. Also, as a result that a pusher block for contacting the electronic device to be tested is affected by an elastic force from at least one elastic means of the two or more elastic means, it becomes possible to select an elastic force obtained from two or more elastic means and to obtain a suitable pressing force for any electronic device to be tested.

While not particularly limited in the above invention, according to the present invention, preferably, said pusher block is detachably attached to said pusher (refer to claim 2). More specifically, it is preferable that said pusher further comprises a load base attached with said pusher block, said load base and said elastic means are provided between said lead pusher base and said pusher base, a part of said pusher block penetrates said load base and contacts at least one of said elastic means, and said pusher block is detachably attached to said load base via an opening portion formed on said pusher base (refer to claim 3).

At the time of changing a kind of electronic device to be tested, it is necessary to change to pushers capable of applying a suitable pressing force for electronic devices to be tested after changing the kind, however, by making only a pusher block detachable from the pusher, exchange of the pushers at the time of changing kinds of electronic devices to be tested can be made extremely easy.

Also, while not particularly limited in the above invention, according to the present invention, preferably, said pusher block comprises two or more shafts protruding perpendicularly from an upper surface, and said two or more shafts include one or more shafts arranged so that each center axis of said one or more shafts coincide with a bottom face of one elastic means among said two or more elastic means of said pusher, and rest of the shafts arranged so that each center axis of said rest of the shafts coincide with a bottom surfaces of other elastic means among said two or more elastic means (refer to claim 8). Furthermore preferably, said pusher block includes a plurality of kinds of pusher blocks wherein said two or more shafts have respectively different lengths (refer to claim 9). More specifically, it is preferable that said two or more shafts of said pusher block include said one or more shafts having a length to contact said one of elastic means of said pusher, and an elastic force of said one of elastic means is given to said pusher block via said one or more shafts, and said rest of the shaft having a length to contact said other elastic means of said pusher, and an elastic force of said other elastic means is given to said pusher block via said rest of the shaft (refer to claim 11).

By providing to the pusher block able to be detached from the pusher two or more shafts protruding from its upper surface, setting to be lengths of being able to apply a suitable pressing force to an electronic device to be tested, bringing a specific shaft to contact only to a specific elastic means, and contracting the elastic means, it becomes possible to obtain any pressing force from two or more elastic means having a wide range of elastic force. Also, by preparing pusher blocks having shafts of lengths able to apply a suitable pressing force for every kind of electronic devices to be tested, pushers can be exchanged swiftly.

Furthermore, while not particularly limited in the above invention, said pusher block preferably includes a plurality of kinds of pusher blocks wherein portions other than said shafts have different lengths in the vertical direction (refer to claim 10).

By preparing a length in the vertical direction of a part other than the shaft of the pusher block for every kind of electronic devices, it becomes possible to deal with difference of thicknesses of electronic devices to be tested before and after changing kinds of the electronic devices to be tested.

Furthermore, while not particularly limited in the above invention, according to the present invention, it is preferable that said lead pusher base of said pusher has an opening portion, said pusher block is detachably fixed to said load base by a fixing means attached by penetrating said load base, and said pusher block is attached/detached as a result that said fixing means is fixed/released via the opening portion of said lead pusher base (refer to claim 13).

By detachably fixing the pusher block by the fixing means attached by penetrating the load base of the pusher, fixing and releasing the fixing means via an opening of a lead pusher base, and attaching and detaching the pusher block so as to exchange only the pusher block, changing of pushers at the time of changing kinds of electronic devices to be tested can be easily attained and an exchanging time of the pushers can be widely reduced.

BRIEF DESCRIPTION OF DRAWINGS

Below, embodiments of the present invention will be explained based on drawings.

BEST MODE FOR CARRYING OUT THE INVENTION

Figure 1:
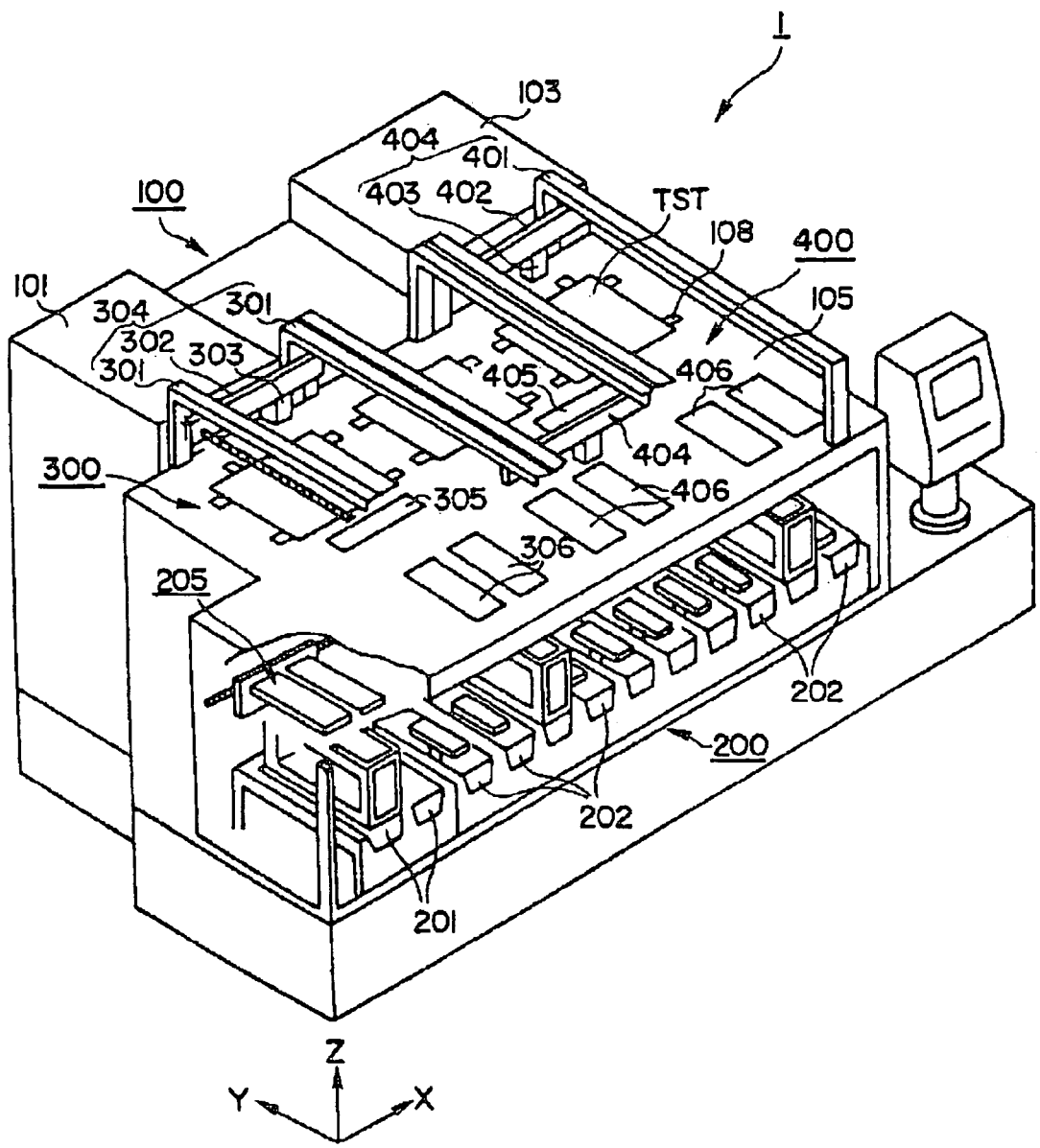
FIG. 1 is a perspective view of an electronic device testing apparatus according to an embodiment of the present invention.
Figure 3:
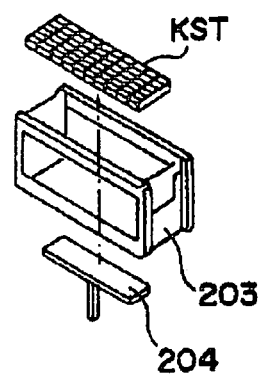
FIG. 3 is a perspective view of the configuration of an IC stocker of the electronic device testing apparatus in FIG. 1.
Figure 4:
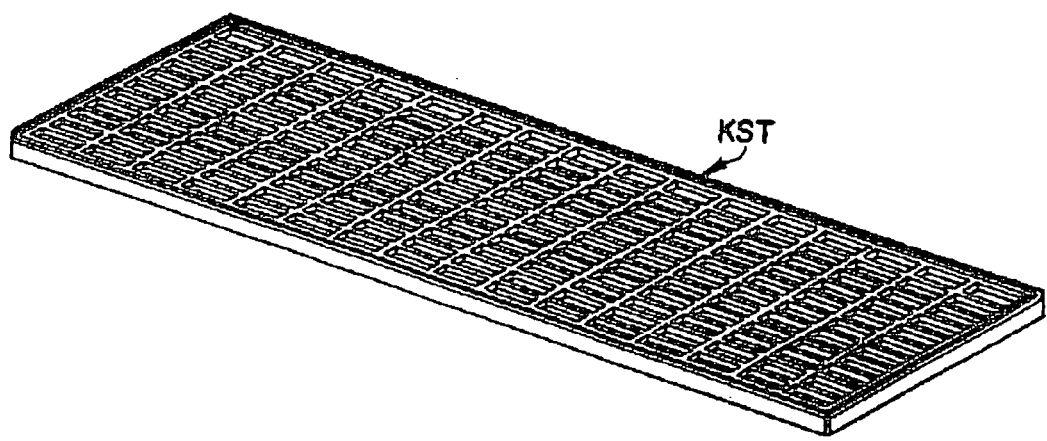
FIG. 4 is a perspective view of a customer tray used in the electronic device testing apparatus in FIG. 1.
Figure 5:
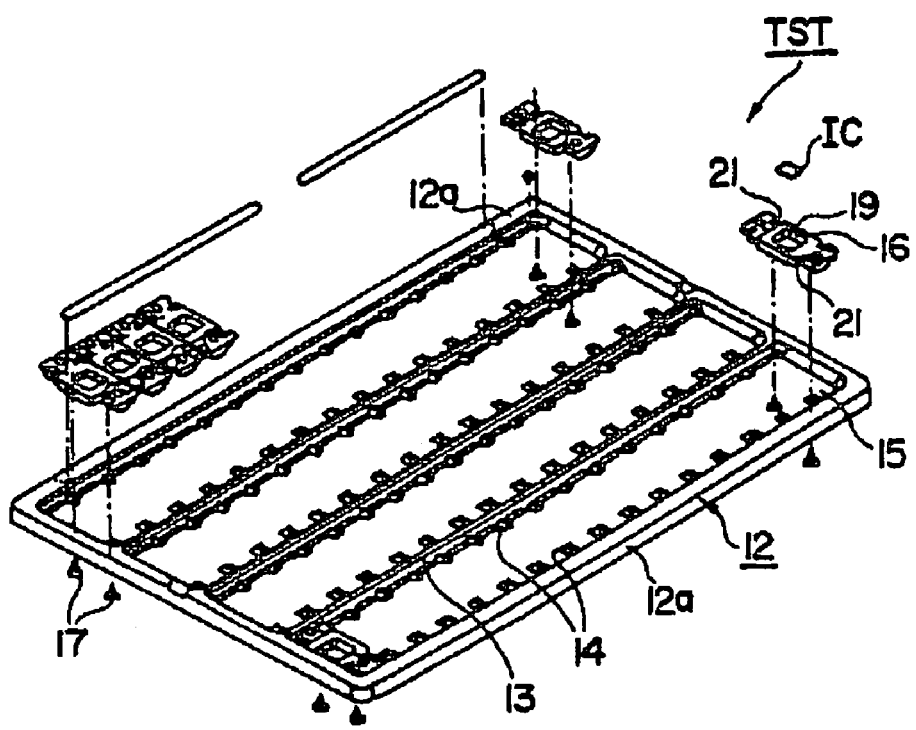
FIG. 5 is a partially disassembled perspective view of a test tray used in the electronic device testing apparatus in FIG. 1.
Figure 6:
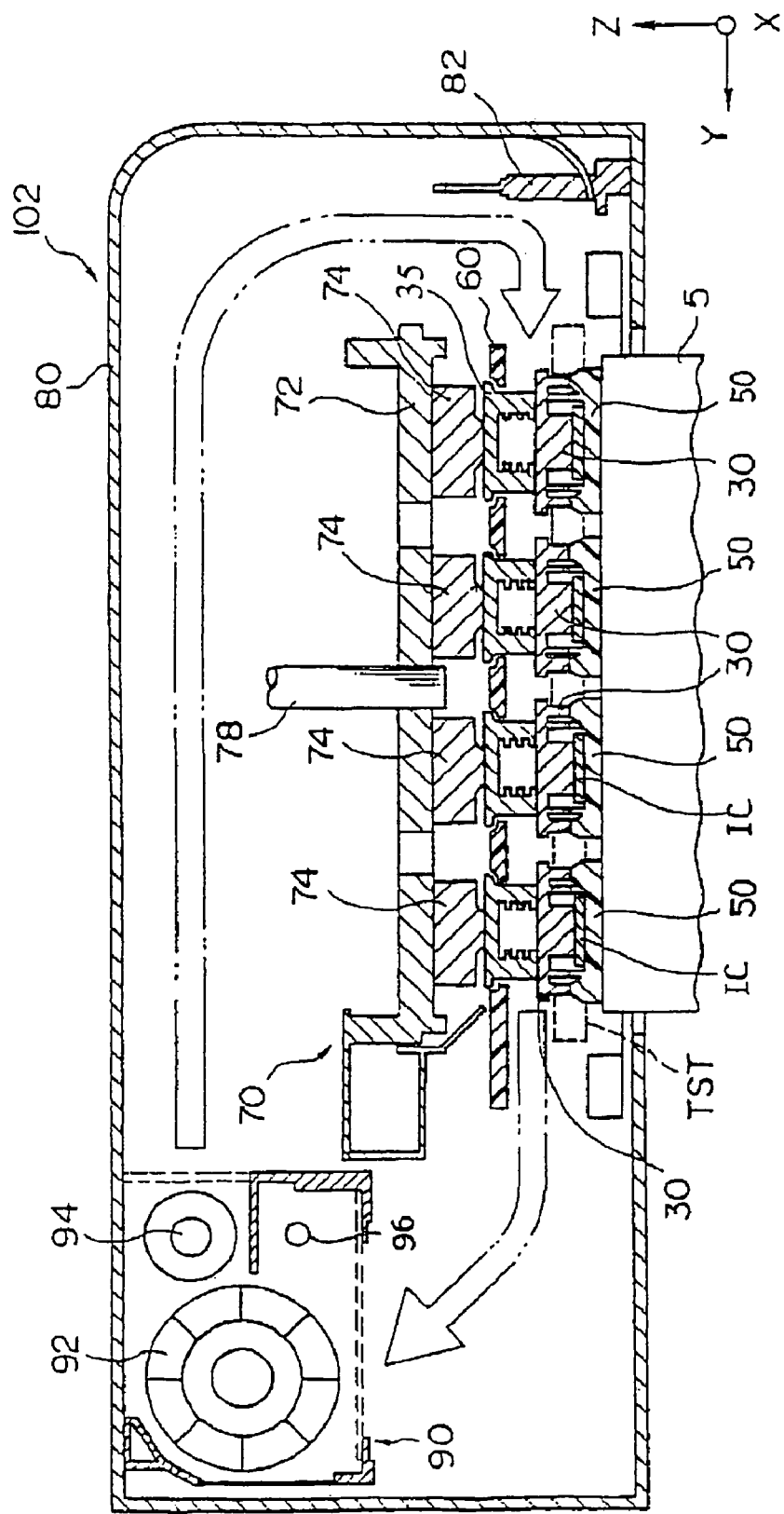
FIG. 6 is a sectional view of a Z-axis driver, a match plate, a test tray and a socket in a measurement section in FIG. 2.

Below, preferred embodiments of the present invention will be explained based on the drawings. FIG. 1 is a perspective view of an electronic device testing apparatus according to an embodiment of the present invention, FIG. 2 is a flowchart of a tray showing a method of handling ICs to be tested in the electronic device testing apparatus in FIG. 1, FIG. 3 is a perspective view of the configuration of an IC stocker of the electronic device testing apparatus in FIG. 1, FIG. 4 is a perspective view of a customer tray used in the electronic device testing apparatus in FIG. 1, FIG. 5 is a partially disassembled perspective view of a test tray used in the electronic device testing apparatus in FIG. 1, FIG. 6 is a sectional view of a Z-axis driver, a match plate, a test tray and a socket in a measurement section in FIG. 2.

Figure 2:
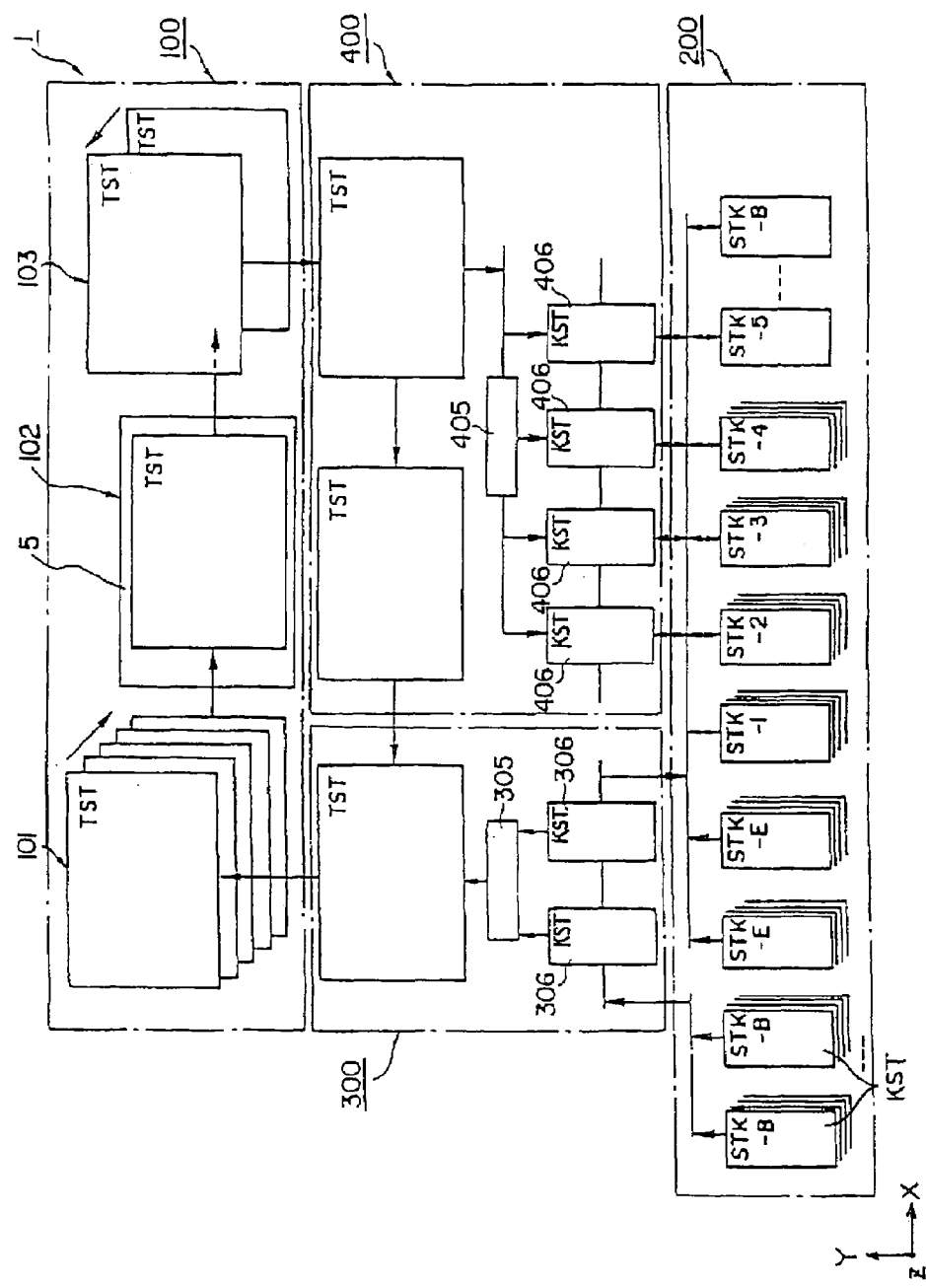
FIG. 2 is a flowchart of a tray showing a method of handling ICs to be tested in the electronic device testing apparatus in FIG. 1.

Note that FIG. 2 is a view for understanding a method of handling ICs to be tested in an electronic device testing apparatus of the present embodiment and partially shows by a plan view members actually arranged aligned in the vertical direction. Therefore, the mechanical (three-dimensional) structure will be explained with reference to FIG. 1.

The electronic device testing apparatus of the present embodiment is an apparatus for testing (inspecting) whether ICs appropriately operate or not in a state the ICs are given a thermal stress of a high temperature or a low temperature and classifying the ICs in accordance with the test results, and is mainly composed of a handler 1, test head 5 and a main testing apparatus (not shown). The operation test under such thermal stress by the electronic device testing apparatus is performed by reloading ICs to be tested from a tray loaded with a large number of ICs to be tested (hereinafter, also referred to as a customer tray KST. Refer to FIG. 4) to a test tray TST (refer to FIG. 5) to be conveyed inside the handler 1.

Therefore, the handler 1 of the present embodiment comprises, as shown in FIG. 1 and FIG. 2, an IC magazine 200 for storing pre-test ICs and storing by classifying post-test ICs, a loader section 300 for transferring the ICs to be tested sent from the IC magazine 200 to a chamber section 100, a chamber section 100 including a test head, and an unloader section 400 for classifying and taking out post-test ICs tested in the chamber 100.

Sockets 50 provided to the test head 5 are connected to the main testing apparatus through a not shown cable, ICs to be tested brought to electrically contact the sockets 50 are connected to the main testing apparatus through a cable, and the ICs to be tested are tested by a testing signal from the main testing apparatus. Note that a space is provided at a part of the handler 1 (refer to a space S in FIG. 13), the test head 5 is arranged at the space in a freely exchangeable way, and the ICs to be tested are able to contact the sockets 50 on the test head 5 through through holes formed on the handler 1. At the time of changing kinds of ICs to be tested, the test head 5 is changed to one having sockets corresponding to a shape and the number of pins of the kind of ICs to be tested.

Below, the handler 1 will be explained.

IC Magazine 200

The IC magazine 200 is provided with a pre-test IC stocker 201 for holding ICs before tested and a post-test IC stocker 202 for holding ICs classified in accordance with the test results.

These pre-test IC stocker 201 and post-test IC stocker 202 comprise, as shown in FIG. 3, a frame-shaped tray support frame 203 and an elevator 204 able to enter from under the tray support frame 203 and move toward the top. The tray support frame 203 supports in it a plurality of stacked customer trays KST, and only the customer trays KST are moved up and down by the elevator 204.

The pre-test IC stocker 201 holds stacked customer trays KST on which the ICs before tested are held, while the post-test IC stocker 202 holds stacked customer trays KST on which ICs finished being tested are classified.

Note that since the pre-test IC stocker 201 and the post-test IC stocker 202 are structured the same, the number of the pre-test stocker 201 and the number of the post-test IC stocker 202 can be set to suitable numbers in accordance with need.

In an example shown in FIG. 1 and FIG. 2, two stockers SKT-B are provided as the pre-test IC stocker 201 and provided next to that with two empty stockers STK-E to be sent to the unloader section 400, and next to that, eight stockers SKT-1, SKT-2, . . . , SKT-8 are provided as the post-test stocker 202 and configured to be able to hold ICs sorted into a maximum of eight classes according to the test results. That is, in addition to classifying ICs as good and defective, it is possible to divide the good ICs into ones with high operating speeds, ones with medium speeds, and ones with low speeds and the defective ICs into ones requiring retesting, etc.

Loader Section 300

The above customer tray KST is conveyed by a tray transfer arm 205 provided between the IC magazine 200 and an apparatus substrate 105 from below the apparatus substrate 105 to an opening 306 of the loader section 300. Then, in the loader section 300, ICs loaded on the customer tray KST are once transferred to a preciser 305 by an X-Y conveyor 304 to correct mutual positions of the ICs to be tested, then, the ICs transferred to the preciser 305 are again loaded on the test tray TST stopped in the loader section 300 by using the X-Y conveyor 304.

The X-Y conveyor 304 for reloading ICs to be tested from a customer tray KST to a test tray TST comprises, as shown in FIG. 1, two rails 301 laid over an apparatus substrate 105, a movable arm 302 able to move back and forth (this direction designated as the Y-direction) between the test tray TST and the customer tray KST by those two rails 301, and a movable head 303 supported by the movable arm 302 and able to move in the X-direction along the movable arm 302.

The movable head 303 of the X-Y conveyor 304 has suction heads (not shown) attached facing downward. The suction heads move while drawing air to pick up the ICs to be tested from the customer tray KST and reload the ICs to be tested on the test tray TST. For example, about eight suction heads are provided for the movable head 303, so it is possible to reload eight ICs to be tested at one time on the test tray TST.

FIG. 5 is a disassembled perspective view of the configuration of the test tray TST used in the present embodiment. The test tray TST has a rectangular frame 12, and the frame 12 is provided with a plurality of bars 13 in parallel at regular intervals. On both sides of the bars 13 and sides 12*a* of the frame 12 facing to the bars 13 are formed a plurality of mounting tubs 14 protruding at regular intervals. Each of insert magazines 15 is composed of between the bars 13, between the bars and the sides 12*a* and two mounting tubs 14.

The each of the insert magazines 15 is to hold one insert 16, and the insert 16 is attached to the two mounting tubs 14 in a floating state by using a fastener 17. For this purpose, on both end portions of the inert 16 are formed a mounting hole 21 for the mounting tab 14. The inserts 16 are, for example, provided to one test tray TST by the number of 16×4 or so.

Note that the respective inserts 16 have the same shape and the same size and each of the inserts holds an IC to be tested. The IC holder 19 of the insert 16 is determined in accordance with a shape of an IC to be tested to be held, and in the example shown in FIG. 5, it has a rectangular concave shape.

Note that in a general customer tray KST, a concave portion for holding an IC is formed relatively larger than a shape of the IC to be tested, so that the position of the IC to be tested in a state of being held on the customer tray KST varies much. Accordingly, if picking up the IC to be tested in this state and carrying directly to the test tray TST, it becomes difficult to accurately drop into an IC holding concave portion formed on the test tray TST. Thus, in the handler 1 of the present embodiment, a position correction means called a preciser 305 is provided between the customer tray KST and the test tray TST. The preciser 305 has a relatively deep concave portion and a rim of the concave portion has a shape surrounded by inclined faces, so that when the IC to be tested picked up by the suction head is dropped into the concave portion, the drop position of the IC to be tested is corrected on the inclined faces. As a result, mutual positions of eight ICs to be tested are accurately determined and the ICs to be tested can be reloaded accurately on the IC holding concave portions formed on the test tray TST by picking up the ICs to be tested after the position correction with the suction heads for reloading.

Chamber Section 100

The above explained test tray TST is loaded with ICs to be tested at the loader section 300, then sent to the chamber section 100, where the respective ICs are tested in the state of being loaded on the test tray TST.

The chamber 100 comprises a constant chamber (soak chamber) 101 for giving a thermal stress of an objected high temperature or a low temperature to the ICs to be tested loaded on the test tray TST, a measurement section (test chamber) 102 wherein the ICs in a state of being given a thermal stress in the constant chamber 101 are brought to contact the test head 5, and an unsoak chamber 103 for removing the given thermal stress from the ICs tested in the measurement section 102. Note that it is preferable that the unsoak chamber 103 is thermally isolated from the constant chamber 101 and the measurement section 102, and actually the unsoak chamber 103 is thermally isolated from a region of the constant chamber 101 and the measurement section 102 applied with a predetermined thermal stress, but the whole is called a chamber section 100 for convenience.

The constant chamber 101 is provided with a vertical conveyor as shown conceptually in FIG. 2, and a plurality of test trays TST are held by the vertical conveyor to wait until the measurement section 102 becomes available. The ICs to be tested are applied a thermal stress of a high temperature or a low temperature mainly while waiting here.

At the center of the measurement section 102 is arranged the test head 5, on which the test tray TST is transferred, and a test is conducted by bringing input/output terminals of the ICs to be tested electrically contact the contact pins 51 of the test head 5. The configuration, etc. thereof will be explained later.

As shown in FIG. 6, inside a sealed casing 80 composing the test chamber 102 is provided a temperature controlling ventilator 90. The temperature controlling ventilator 90 comprises a fan 92, a heater 94 and a nozzle for emitting liquid nitrogen. By drawing in an air inside the casing 80 and blowing out hot wind or cold wind by the heater 94 or the nozzle 96 in the casing 80, a predetermined temperature condition (a high temperature or a low temperature) is attained inside the casing 80. Due to this, it is possible to maintain inside the casing 80 at a high temperature of, for example, from the room temperature to 160° C. or so or a low temperature of, for example, −60° C. to the room temperature. The temperature inside the casing 80 is detected, for example, by a temperature sensor 82 and an airflow amount of the fan 92 and a heat amount by the heater 94 or an emission amount by the nozzle 96, etc. are controlled in order to maintain inside the casing 80 at a predetermined temperature.

Note that the hot wind or cold wind generated by the temperature controlling ventilator 90 circulates inside the casing by flowing in the Y-axis direction at an upper portion of the casing 80, falling along a side wall on the casing on the opposite side from the temperature controlling ventilator 90, passing through a space between the match plate 60 and the test head 5 to return back to the temperature controlling ventilator 90.

On the other hand, the test tray TST finished the test is removed a thermal stress in the unsoak chamber 103 so as to bring the temperature of the post-test ICs 2 to the room temperature, then, taken out to the unloader section 400. Also, by a test tray conveyor 108 provided to the apparatus substrate 105, the test tray TST taken out from the unsoak chamber 103 is sent back to the constant chamber 101 via the unloader section 400 and the loader section 300.

Below, a pusher 30, a match plate 60 and a Z-axis driver 70 used in the measurement section 102 will be explained in detail.

Figure 7:
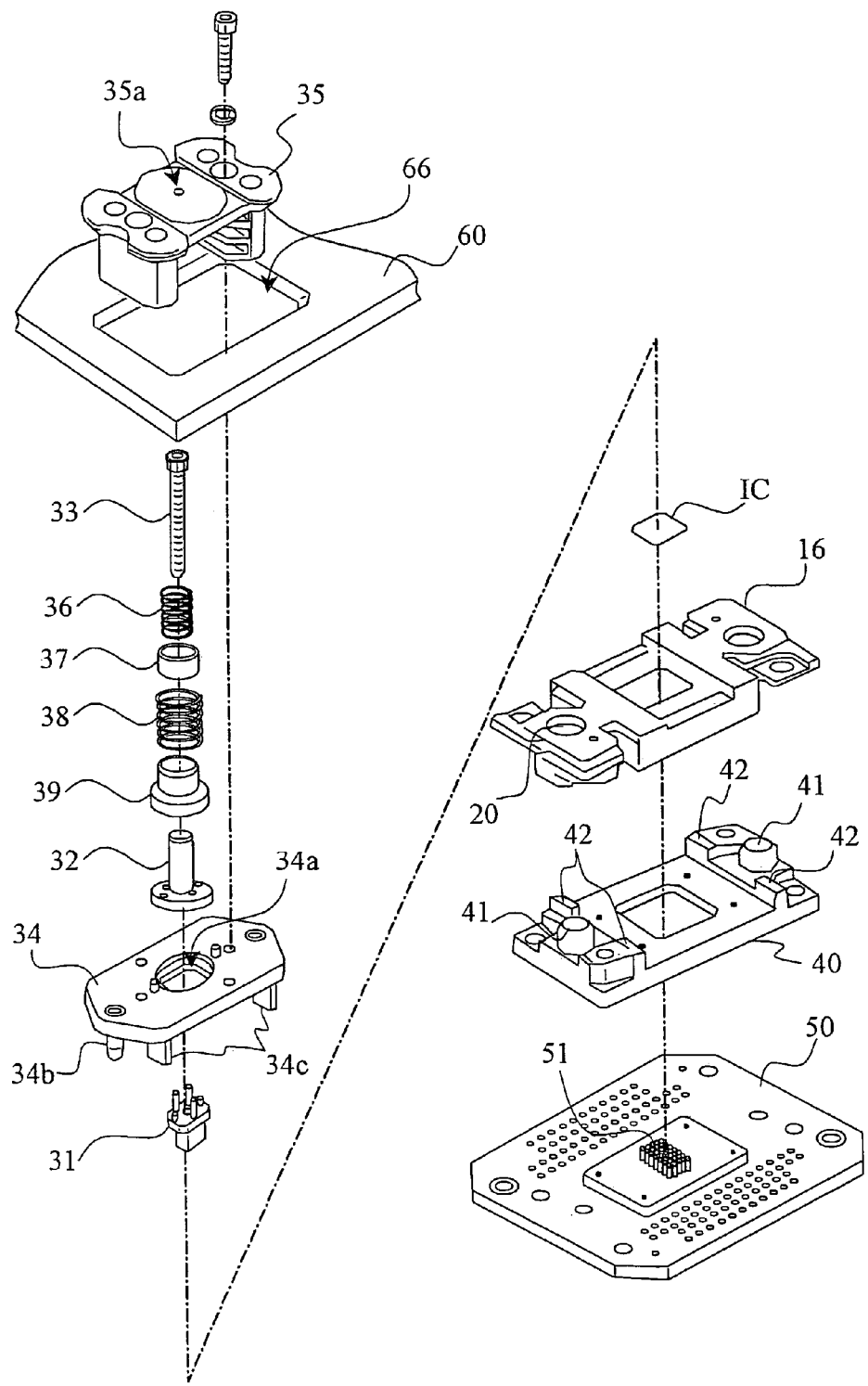
FIG. 7 is a disassembled perspective view of the configuration of a socket comprising a pusher, match plate, insert, socket guide and contact pins used in an electronic device testing apparatus according to an embodiment of the present invention.
Figure 8:
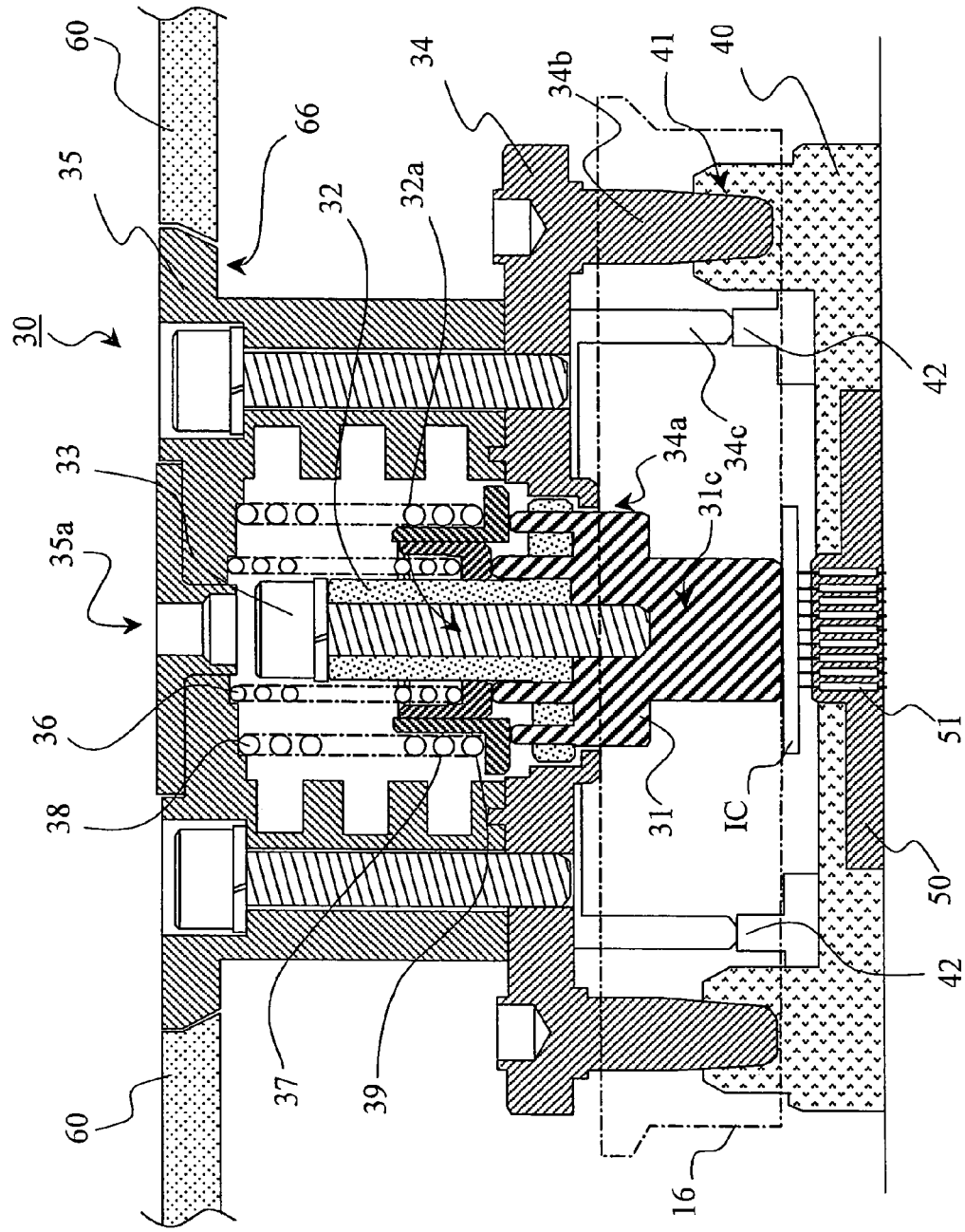
FIG. 8 is a sectional view of FIG. 7 showing a state where a pusher is lowered in the test head.
Figure 9:
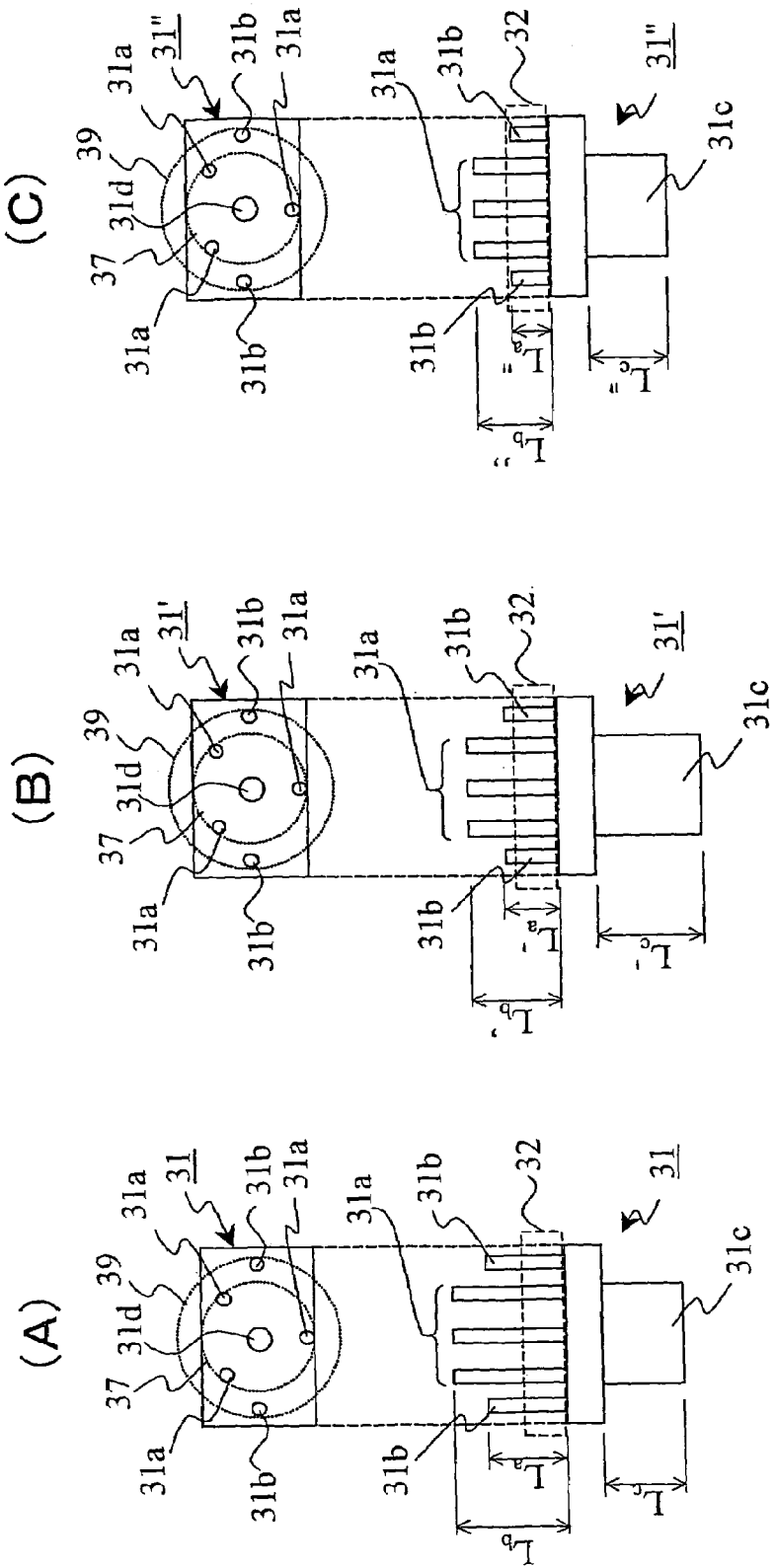
FIG. 9(A), FIG. 9(B) and FIG. 9(C) are plan views and views from the side of a pusher guide according to an embodiment of the present invention.
Figure 10:
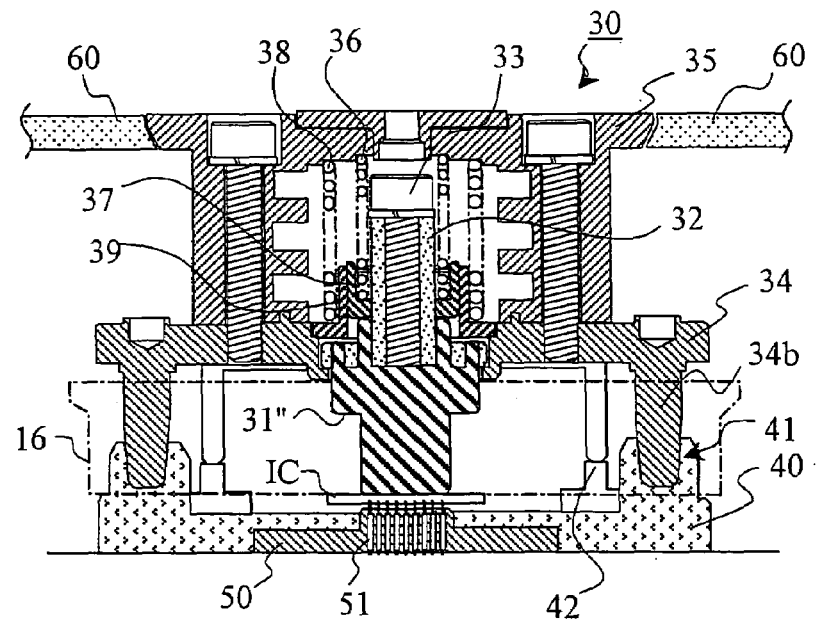
FIG. 10 is a sectional view of a pusher attached with the pusher block shown in FIG. 9(C).
Figure 11:
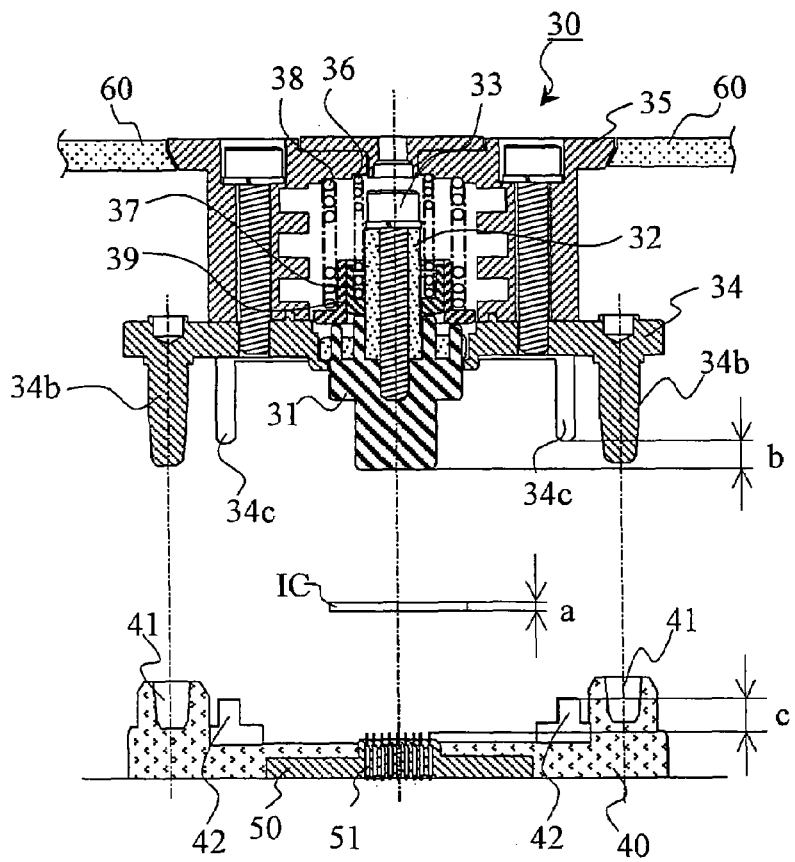
FIG. 11 is a sectional view of positional relationship of the pusher, socket guide and contact pins in FIG. 8.
Figure 12:
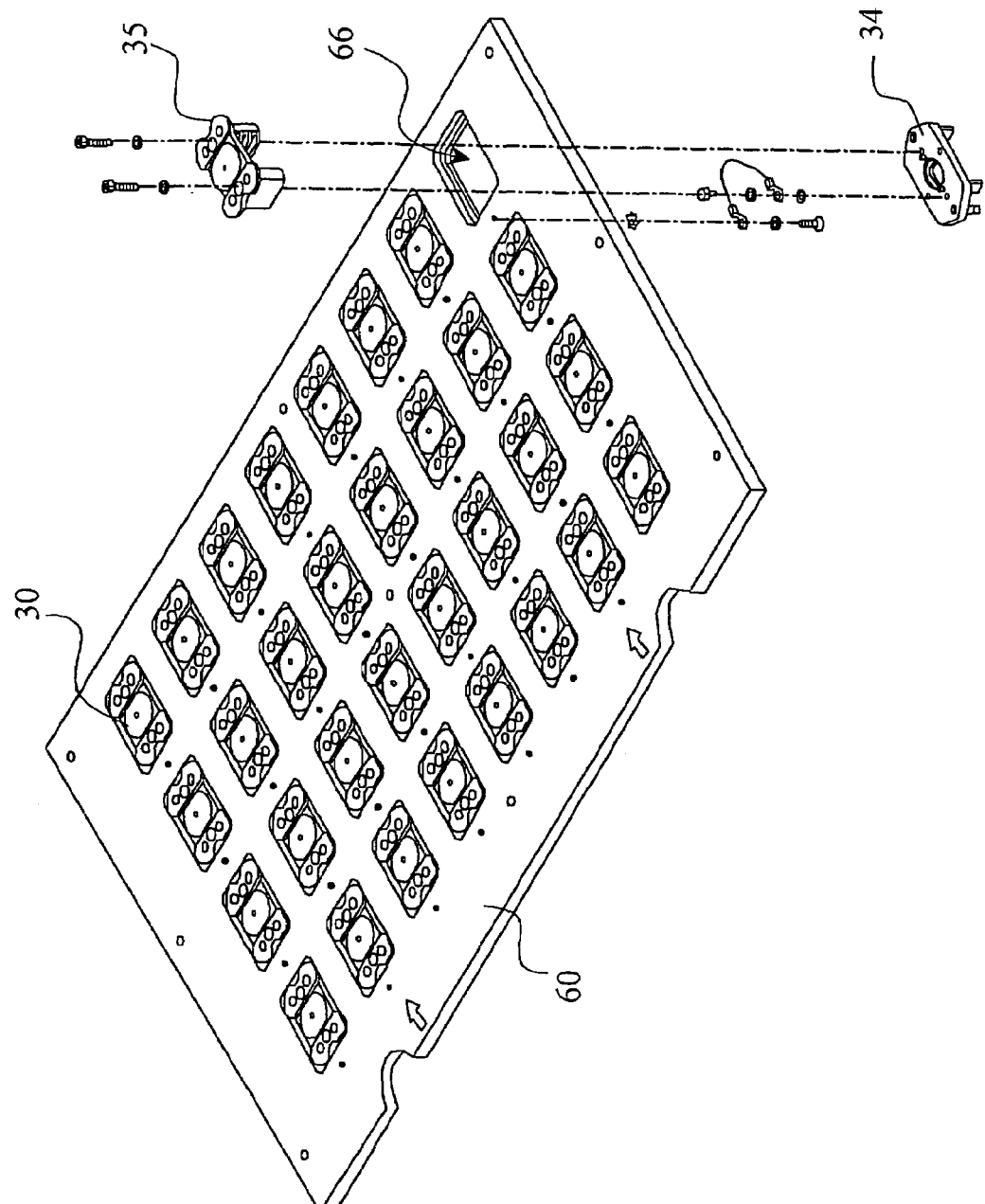
FIG. 12 is a perspective view of a match plate used in an electronic device testing apparatus according to an embodiment of the present invention.
Figure 13:
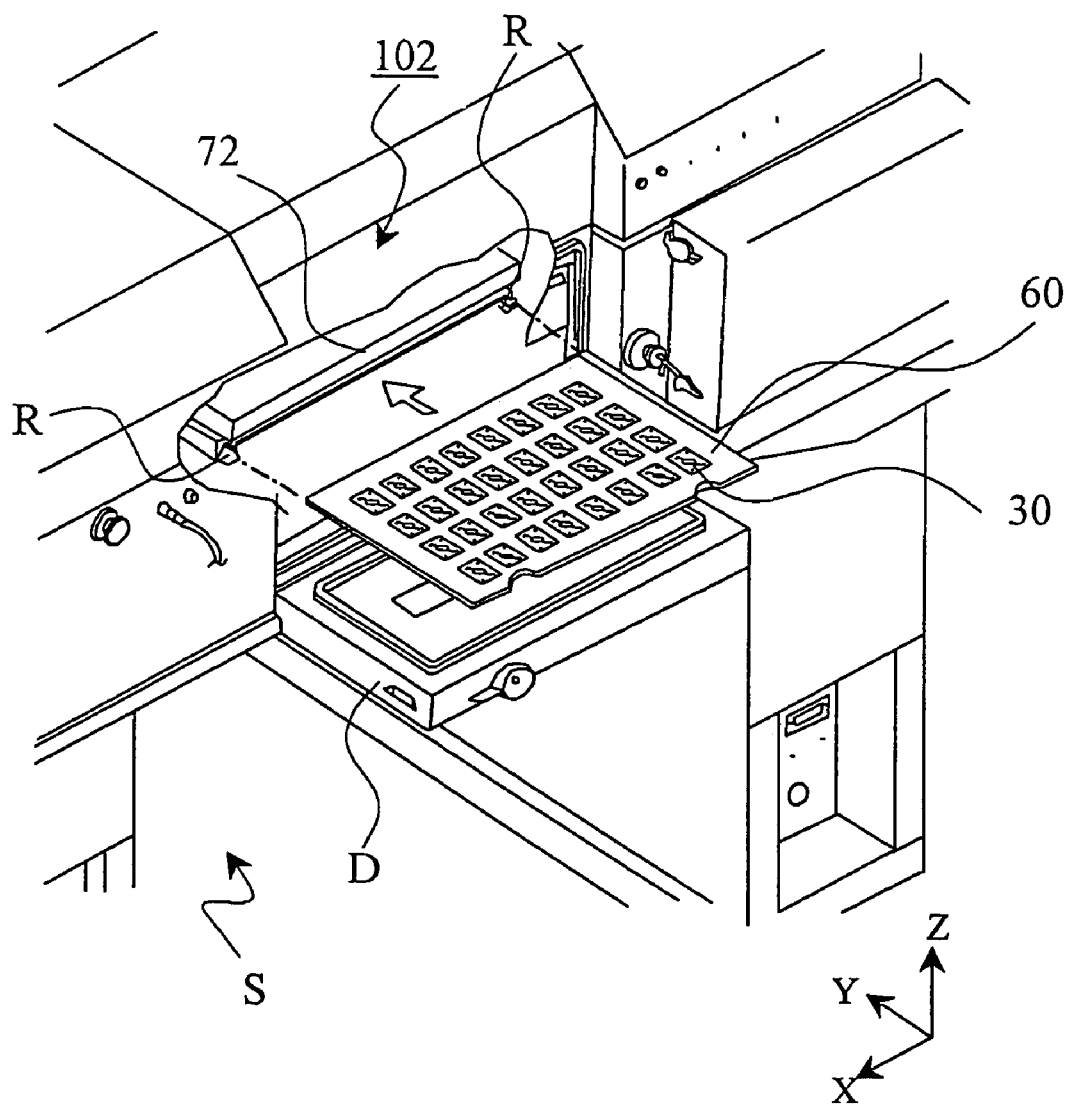
FIG. 13 is a perspective view for explaining a mounting method of a match plate to an electronic device testing apparatus according to an embodiment of the present invention.
Figure 14:
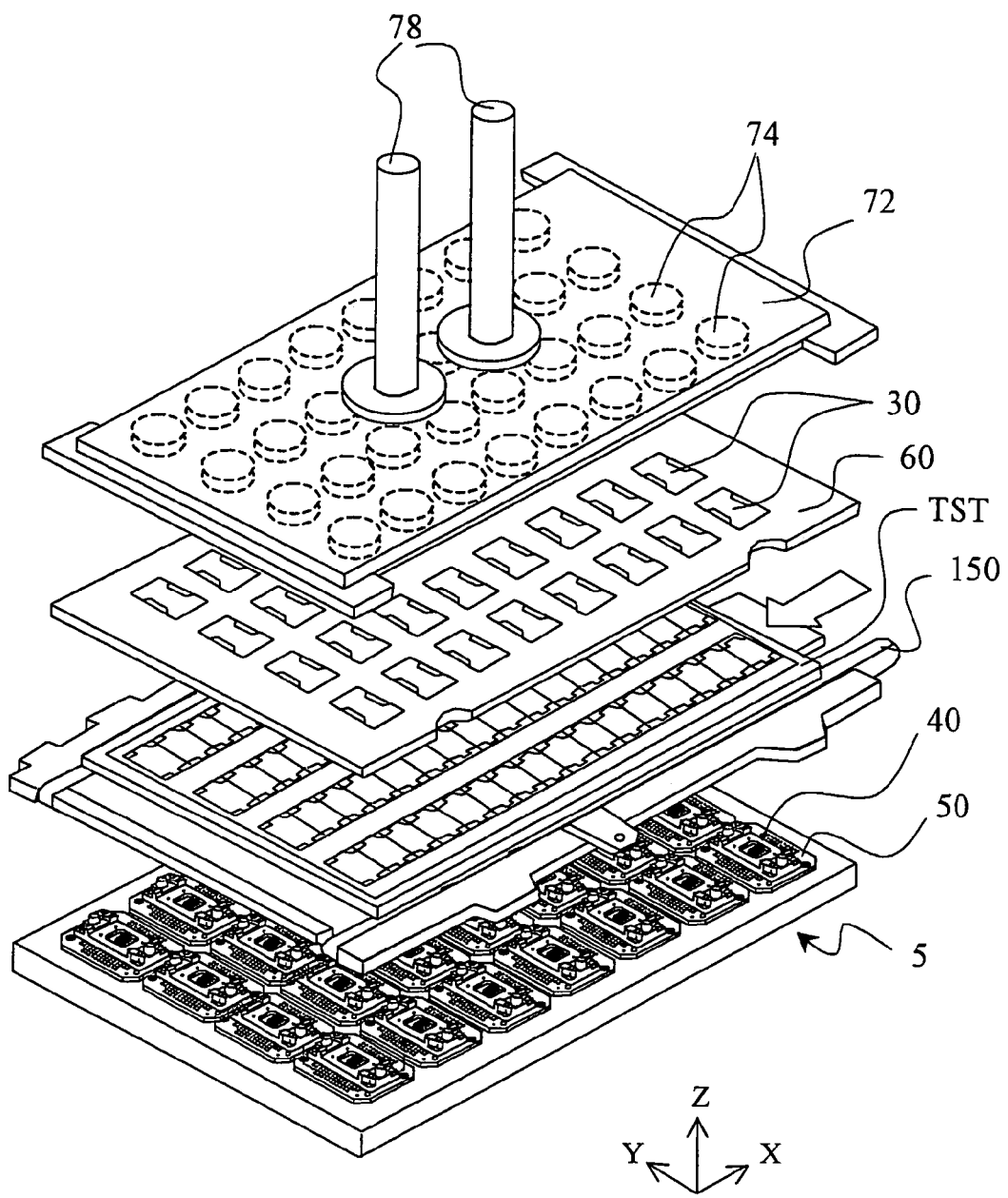
FIG. 14 is a disassembled perspective view showing a Z-axis driver, match plate, test tray and socket in a measurement section of an electronic device testing apparatus according to an embodiment of the present invention.
Figure 15:
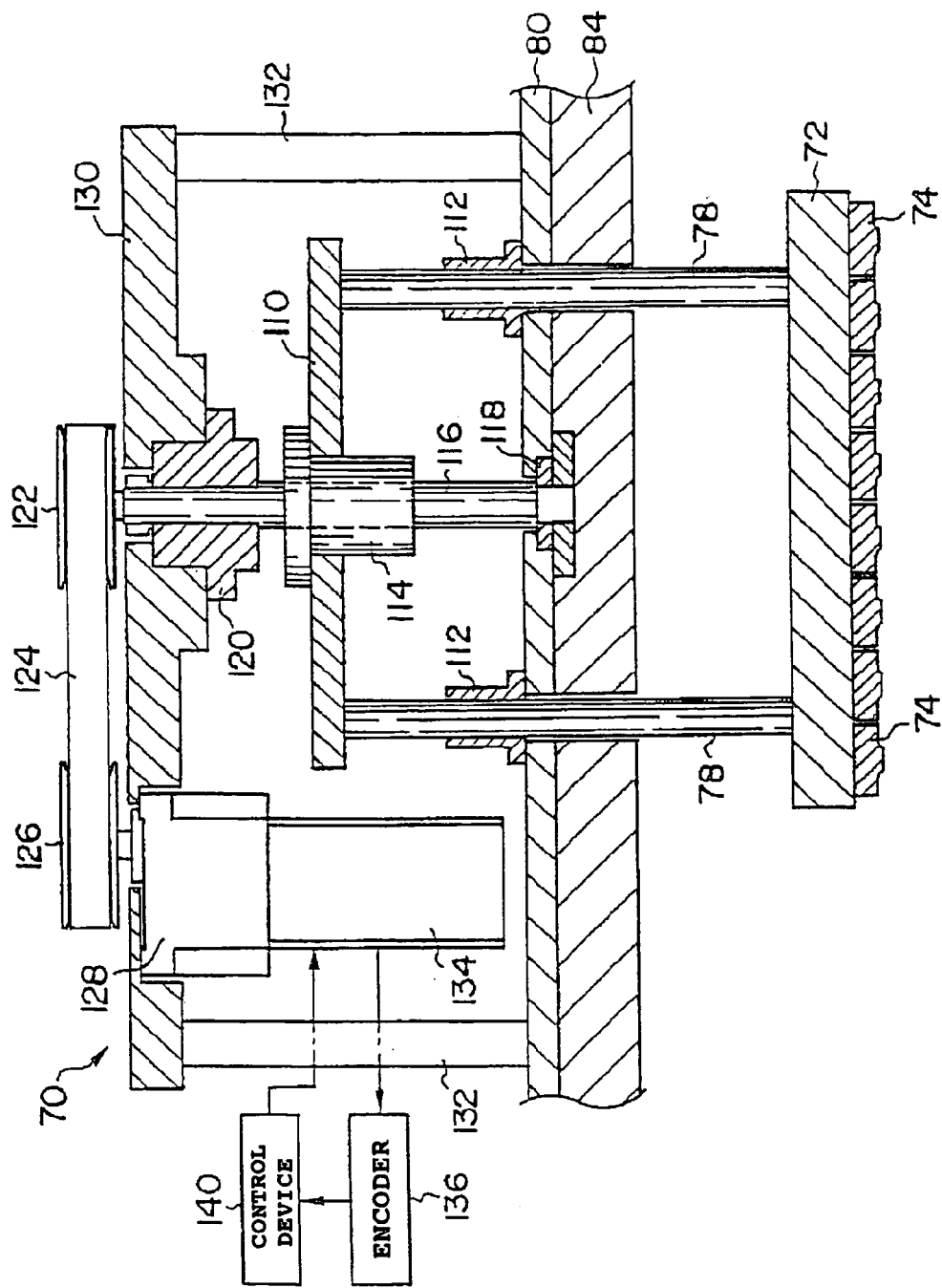
FIG. 15 is a sectional view of an example of a Z-axis driver in a measurement section of a chamber of an electronic device testing apparatus according to an embodiment of the present invention.

FIG. 7 is a disassembled perspective view of the configuration of a socket comprising a pusher, match plate, insert, socket guide and contact pins used in the electronic device testing apparatus according to the embodiment of the present invention, FIG. 8 is a sectional view of FIG. 7, FIG. 9(A), FIG. 9(B) and FIG. 9(C) are plan views and views from the side of the pusher guide according to the embodiment of the present invention, FIG. 10 is a sectional view of the pusher attached with the pusher block shown in FIG. 9(C), FIG. 11 is a sectional view of positional relationship of the pusher, socket guide and contact pins in FIG. 8, FIG. 12 is a perspective view of the match plate used in the electronic device testing apparatus according to the embodiment of the present invention, FIG. 13 is a perspective view for explaining a mounting method of the match plate to the electronic device testing apparatus according to the embodiment of the present invention, FIG. 14 is a disassembled perspective view showing the Z-axis driver, match plate, test tray and socket in the measurement section of the electronic device testing apparatus according to the embodiment of the present invention, FIG. 15 is a sectional view of an example of the Z-axis driver in the measurement section of the chamber of the electronic device testing apparatus according to the embodiment of the present invention.

The pusher 30 is provided above the test head 5 and means for applying a suitable pressing force to an IC to be tested by moving up and down in the vertical direction by a later explained Z-axis driver 70. The pusher 30 is mounted on a later explained match plate 60 in accordance with intervals of ICs to be tested at a time (a total of 32 on every other row in four lines on the above test tray TST).

As shown in FIG. 7 and FIG. 8, the pusher 30 comprises a lead pusher base 35 and a pusher base 34 pressed by a pressing portion 74 formed on a driver plate 72 of the Z-axis driver 70 to move up and down in the vertical direction, two springs 36 and 38 for giving an elastic force to the pusher block 31, a load base 32 for supporting the springs 36 and 38, and a pusher block 31 detachably attached to the load base 32 with a fixing bolt 33.

The lead pusher base 35 and the pusher base 34 are fixed with two bolts as shown in FIG. 7 and FIG. 8, and on both sides of the pusher base 34 are provided with a guide pin 34b to be inserted to a later explained guide hole 20 of insert 16 and a guide bush 41 of the socket guide 40. Also, the pusher base 34 is provided with stopper guides 34c for regulating the lower limit at the time the pusher base 34 is lowered by the Z-axis driver 70. As a result that the stopper guide 34c contacts a later explained stopper surface 42 of the socket guide 40, a reference size of the lower limit position of the pusher for pressing with a suitable pressing force of not breaking an IC to be tested is determined. At the approximate center of an upper face of the lead pusher base 35 is formed a through hole 35a for attaching and detaching for exchanging only the pusher block 31 at the time of changing kinds of ICs to be tested. Also, at the approximate center of the pusher base 34 is formed an opening 34a for attaching the pusher block 31 to the load base 32. A upper side shape of the opening 34a is a little larger than the outermost circumference of the load base 32, and a lower side shape of the opening 34a is smaller than the outermost circumference of the load base 32 and a little larger than the outermost circumference of the pusher block 31.

Note that as shown in the same figures, for highly accurate alignment of the pusher block 31 and the IC to be tested with the contact pins 51, the socket guide 40 is provided on each socket 50 and the insert 16 is provided to the test tray TST. Each socket guide 40 is formed two guide bushes 41 for fitting with the guide pins 34b provided to the pusher base 34 and four stopper faces 42 for contacting the stopper guides 34c provided to the pusher base 34 at the time the pusher 30 is pressed. Also, the insert 16 is formed two guide holes for being inserted the guide pins 34b provided to the pusher base 34 at the time the pusher 30 is pressed. At the time that the pusher 30 is pressed, the two guide pins 34b provided to the pusher base 34 are respectively inserted to the guide holes 20 formed on the insert 16 and fitting in the guide bushes 41 formed on the guide socket 40, so that highly accurate alignment of the pusher block 31 and the IC to be tested with the contact pins 51 can be secured. Also, as a result that the stopper guides 34c formed on the pusher base 34 penetrates the insert 16 and contact the guide faces 42 formed on the socket guide 40, a reference size of the lower limit position of the pusher is determined and breaking, etc. of the IC to be tested is prevented.

The load base 32 has convex two-stage cylinder shape arranged so that an axis of the through hole 32a for the fixing bolt 33 to fit becomes a center thereof. The first stage of the cylindrical shape close to the head of the fixing bolt 33 has a smaller outer diameter than an inner diameter of an opening of a first ring 37, and the second cylindrical shape (hereinafter, also simply referred to as a base portion) has a larger outer diameter than the inner diameter of the opening of a second ring 39. Furthermore, on the lower face of the base portion of the load base 32 is formed five through holes, to which five shafts 31a and 31b protruding from the pusher block 31 are inserted.

The first ring 37 is a cylinder having a concave shape wherein a larger opening than the outer diameter of the first stage of the load base 32 is formed at the bottom and supports the first spring 36 by the concave portion. The second ring 39 is a cylinder having a convex shape formed with a through hole along its center axis to which the first ring 37 can be inserted, and the second spring 38 is supported by the convex portion. The base portion of the load base 32 supports the first ring 37 and the second spring 39.

Accordingly, relation of diameters of load base 32, the two springs 36, 38 and two rings 37, 39 of [outer diameter of first stage of load base 32]<[inner diameter of opening of first ring 37]<[outer diameter of first spring 36]<[inner diameter of first stage of concave portion of first ring 37]<[outer diameter of first ring 37]<[inner diameter of through hole of second ring 39]<[outer diameter of first stage of convex portion of second ring 39]<[inner diameter of second spring 38]<[outer diameter of second stage of load base 32] stands, and coaxially arranged from inside in an order of the load base 32, the first spring 36 and the second spring 38.

FIG. 9(A) shows the pusher block 31 for applying a suitable pressing force to an IC to be tested, for example, having 132 pins, the upper diagram is a plan view and the lower diagram is a view from the side. Also, FIG. 9(C) shows a pusher block 31" for applying a suitable pressing force to an IC to be tested, for example, having 56 pins, which is the case a less pressing force than in FIG. 9(A) is required, FIG. 9(B) shows a pusher block 31' capable of applying a pressing force of between the cases of FIG. 9(A) and FIG. 9(C). The upper diagram is a plan view and the lower diagram is a view from the side in any drawings. Note that circles with a dotted line in the upper diagrams of FIG. 9(A), FIG. 9(B) and FIG. 9(C) indicate the first ring 37 and the second ring 39, and the rectangles with a dotted line in the lower diagrams indicate the base portion (second stage of the convex shape) of the load base.

As shown in FIG. 9, a base portion 31c of the pusher block 31 is made by metal material, etc. to be in a square pole shape with two stages, and an upper face of the pusher block 31 is attached with five shafts 31a and 31b protruding upward in the vertical direction. As shown in the same figure, three first shafts 31a are arranged so that each center axis of the first shafts 31a coincide with the bottom surface of the first ring 37 attached to the first spring 36 positioned inside, and the two shafts 31b are arranged so that each center axis of the second shafts 31b coincide with the bottom surface of the second ring 39 attached to the second spring 38. An elastic force of the first spring 36 is transferred through the first ring 37 to the first shaft 31a penetrating the through hole formed on the base portion of the load base 32, an elastic force of the second spring 38 is transferred through the second ring 39 to the second shaft 31b penetrating the through hole formed on the base portion of the road base 32, and the elastic forces are applied to the pusher block 31.

The square pole positioned on the lower stage in the vertical direction of the base portion 31c of the pusher block is smaller than that of the upper stage and has a sufficient outer diameter to press an IC to be tested, and a test is conducted as a result that the lower face of the square pole at the lower stage contacts the IC to be tested to press the socket 50. Also, at the approximate center of the upper face of the base portion 31c is formed a bolt fixing hole for fixing with the fixing bolt 33.

Here, since the suitable pressing force at the test is different in each of kinds of ICs to be tested due to the number and length of pins of the ICs to be tested, pusher blocks 31 suitable to the respective kinds of ICs to be tested are prepared for each kind of ICs. The pusher block 31, for example, for ICs to be tested with 132 pins shown in FIG. 9(A) is required to have a relatively strong pressing force, so that a length La of the first shafts 31a and a length Lb of the shafts 31b are made to be the length to sufficiently penetrate the base portion of the load base 32. Due to this, elastic forces of the first spring 36 and the second spring 38 can be transferred to the pusher block 31.

On the other hand, FIG. 9(B) shows a pusher block 31' capable of applying a weaker pressing force than in the case of FIG. 9(A), and all of the shafts 31a and 31b have the length to sufficiently penetrate the base portion of the load base 32. However, when compared with the case of FIG. 9(A), lengths of the shafts 31a and 31b are made relatively short (La>La', Lb>Lb'), and contraction amount of the springs 36 and 38 caused by pressing by the shafts 31a and 31b become small, consequently, a pressing force applied to the pusher block 31 also decreases.

Furthermore, since a test is conducted with a still weaker pressing force in a pusher block 31", for example, for ICs to be tested with 56 pins shown in FIG. 9(C), a length La" of the first shafts 31a has a length to sufficiently penetrate the base portion of the load base 32 (La'>La"), however, a length Lb" of the second shafts 31b is a length not to penetrate the base portion of the load base 32 (Lb'>Lb"), so that an elastic force of the first spring 36 is transferred to the pusher block 31 but an elastic force of the second spring 38 is not transferred. Incidentally, FIG. 10 shows a sectional view of the pusher 30 attached with the pusher block 31".

As explained above, by providing two springs to the pusher, a wide range of a pressing force can be obtained from one pusher. Also, by enabling to change only the pusher block from the pusher, it becomes possible to deal with pressing forces in accordance with shapes, the numbers and lengths of pins, etc. of ICs to be tested when changing kinds of ICs to be tested only by exchanging to the pusher block corresponding to the kind. Note that three or more springs may be provided if a size of the pusher permits for further widening the adjustable range of a pressing force to be applied to ICs to be tested.

Furthermore, by changing the lengths of shafts on the pusher block, elastic forces obtained from the two springs can be adjusted, so that it becomes possible to suitably respond to a pressing force required by an IC to be tested. It is also possible to furthermore suitably adjust a pressing force corresponding to each kind of ICs to be tested by not transferring an elastic force from a spring to the pusher block by making either of the shafts not to contact the corresponding spring.

Along with changing kinds of ICs to be tested, the thickness of the ICs to be tested also changes in some cases. In such a case, as shown in FIG. 9(A) and FIG. 9(B), the length Lc of the base portion 31c may be changed in order to deal with the thickness of the IC to be tested.

In the pusher 30 configured as above, the first ring 37 attached with the first spring 36 is inserted to an opening on the second ring 39 attached with the second spring 38, and the first-stage cylinder of the load base 32 inserted with the fixing bolt 33 is inserted to an opening of the first ring 37. Then, respective bottom faces of the load base 32, the first ring 37 and the second ring 39 are inserted to the opening 34a of the pusher base 34, the lead pusher base 35 is put thereon from above, and the lead pusher base 35 and the pusher base 34 are fixed with two bolts. Furthermore, by inserting the respective five shafts of the pusher block 31 through the openings 34a on the pusher base 34 to the through holes formed on the bottom face of the load base 32, and fastening the fixing bolt 33 with a wrench, etc. from the opening 35a of the lead pusher base 35 to fix the pusher block 31, the pusher 30 is assembled.

When changing the pusher block 31 at the time of changing kinds of ICs to be tested, by easing to detach the bolt 33 with a wrench, etc. through the opening 35a formed on the lead pusher base 35, only the pusher block 31 is detached from the pusher 30. Then, it is possible to easily change to other pusher block 31 suited to the ICs to be tested after changing the kind by inserting the shafts 31a and 31b to the through holes on the bottom face of the load base 32 and fastening the fixing bolt with a wrench, etc. through the opening 35a on the lead pusher base 35, so that a time for exchanging the pusher 30 can be remarkably reduced.

As shown in FIG. 12, the pushers 30 are mounted by the number of 32, 8 rows×4 lines on the match plate 60 to attain easy exchanging at the time of changing kinds of ICs to be tested. The match plate 60 has a substantially rectangular plate shape and formed attachment holes 66, to which the lead pusher base 35 of the pusher 30 is inserted, by substantially the same arrangement and the number as those of sockets 50 arranged on the test head 5.

The pushers 30 are attached to the match plate 60 first by attaching the lead pusher bases 35 to the attachment holes 66 formed at regular intervals on the match plate 60 from above. At this time, a surface of the lead pusher base to contact the attachment hole 66 is formed to be taper and sidewalls of the opening of the attachment hole 66 is also formed to be taper corresponding thereto, so that the lead pusher base 35 is supported by the match plate 60. Next, the first spring 36 and the first ring 37, the second spring 38 and the second ring 39, and the fixing bolt 33 and the load base 32 are attached to the pusher base 34 and attached to the match plate by fixing with bolts on both sides of the lead pusher base 35. Note that the springs 36 and 38, the rings 37 and 39, the fixing bolts 33 and the load base 32 are not illustrated in FIG. 12.

Furthermore, the match plate 60 attached with the pushers 30 is mounted so that it is placed above the test head 5 and that the test tray TST can be transferred between the pusher 30 and the sockets 50. Specifically, as shown in FIG. 13, it is set by inserted to the rails R fixed pendent from the drive plate 72, and an attachment/detachment operation is performed by opening a door D provided to the chamber of the measurement section 102. Note that FIG. 11 is a view from the back of the handler 11. At the time of changing kinds of ICs to be tested, the door D is open and the match plate 60 is pull out from the rails R, only the pusher blocks 31 of the respective pushers 30 on the match plate 60 are changed to those corresponding to the kind by the above procedure without detaching the pushers 30, the match plate 60 is again inserted on the rails R, and the procedure of pushers for exchanging kinds is completed.

The measurement section 102 of the chamber 100 is configured as below.

As shown in FIG. 14, on the upper face of the test head 5, the sockets 50 are arranged by the number corresponding to ICs to be tested (a total of 32), for example, by four rows in the Y-axis direction and eight rows on every other row in the X-axis direction for the test tray TST shown in the figure (four rows in the Y-axis direction and 16 rows in the X-axis direction in FIG. 14). Note that if a size of the respective sockets can be made smaller, the sockets 50 may be arranged by four rows (Y-axis direction)×16 rows (X-axis direction) on the test tray 5, so that all ICs to be tested loaded on the test tray TST can be tested at a time.

Each of the sockets 50 has a plurality of contact pins 51, which are biased upward by a spring, etc. Accordingly, when an IC to be tested is pressed, the contact pins 51 recede to the upper surface of the socket 50, but all terminals of the IC to be tested are able to contact the contact pins 51. Also, on each socket 50, a socket guide 40 is provided for securing highly accurate alignment of the pusher 30 with the insert 16.

Above the test head 5 provided with the sockets 50 is transferred a test tray TST by a conveyor mechanism 150, such as a belt conveyor, and inserts 16 by the number in accordance with intervals of ICs to be tested at a time (a total of 32 on every other row in the X-axis direction on the above test tray TST) are positioned on corresponding sockets 50.

Furthermore, the above match plate 60 attached with the pushers 30 is placed, so that the respective pushers 30 position above the 32 sockets 50 on the test tray TST. When each of the pushers 30 attached on the match plate 60 is pressed at the time of the test, the guide pins 34b provided to the pusher base 34 of the pusher 30 are inserted to the guide holes 20 of the insert 16 positioned in the vertical direction of the pusher 30 to fit in the guide bushes 41 formed on the socket guide 40 positioned in the vertical direction of the insert 16, so that 32 ICs to be tested held on the test tray TST are highly accurately aligned with the contact pins 51 of corresponding sockets 50 for conducting a test.

Above the casing 80 of the measurement section 102, to which the test tray TST is conveyed, is provided with the Z-axis driver 70. Note that a thermal insulating material 84 is put on inner walls of the casing 80. As shown in FIG. 15, a pair of driver axes 78 penetrate the casing 80 to extend upward above the casing 80, and their upper ends are connected to the upper plate 110. A pair of bushes 112 are fixed on top of the casing 80, and movement of the driver axes 78 in the Z-axis direction is allowed by the bushes 112.

At the approximate center portion of the upper plate 110 is fixed a ball screw adopter 114. A female screw is formed on the adopter 114 for screwing together with a male screw of a main driver axis 116. At the lower end of the main driver axis 116 is freely rotatably supported by a rotation bearing 118 buried inside the casing 80, and the upper end thereof is freely rotatably held by a rotation bearing 120 attached to a supporting frame 130.

The supporting frame 130 is mounted on top of the casing 80 with supporting rods 132. The upper end of the main driver axis 116 protrudes above the supporting frame 130 where a first pulley 122 is fixed. Also, a second pulley 126 is arranged on the supporting frame 130 away by a predetermined distance from the first pulley 122 and the two are connected by a power transmission belt 124.

A rotation axis of the second pulley 126 is connected to a gear box 128, the gear box 128 is connected to a rotation axis of a step motor 134, and when the rotation axis of the step motor 134 rotates, the second pulley 126 is rotated. When the second pulley 126 is rotated, the rotation power is transmitted to the first pulley 122 via the belt 124 and the first pulley 122 rotates. When the first pulley 122 rotates, the main driver axis 116 also rotates, consequently, the adopter 114 converts the rotation motion of the driver axis 116 to linear motion to move the upper plate 110 along the Z-axis direction. When the upper plate 110 moves, the driving power transmits to the driver plate 72 via the driver axis 78 to move the driver plate 72 along the Z-axis direction.

Due to the movement of the driver plate 72 along the Z-axis direction, the lead pusher base 35 of the pusher 30 is pressed and the springs 36 and 38 contract, so that the pusher block 31 applies a suitable pressing force to the IC to be tested.

Note that as shown in the figure, the motor 134 is built-in or attached with an encoder 136 as a sensor for being able to measure a rotation amount of the rotation axis of the motor 134. An output signal from the encoder 136 is sent to a motor control device 140, and the motor control device 140 controls driving of the motor 134.

On the lower surface of the driver plate 72 is fixed (or being able to slightly move to press) pressing portions 74 by the number corresponding to the lead pusher bases 35 appeared on the above explained match plate 60 so as to press the upper surface of the lead pusher base 35 held on the match plate 60. Note that four rows of pressing portions 74 are illustrated on the driver plate 72 in FIG. 6 for convenience and the number of the driver axis illustrated is one, however, actually the pressing portions 74 are arranged by four rows in the Y-axis direction and eight rows in the X-axis direction and the number of the driver axes is two as shown in FIG. 14 and FIG. 15. Note that the numbers are not particularly limited.

The match plate 60 holds a plurality of lead pusher bases 35 (4 rows×8 rows=32 in the present example) by the number corresponding to the number of sockets 50 in a slightly movable way, and pushers 30 are fixed at the lower ends of the lead pusher bases 35, respectively. Accordingly, the pusher 30 can move slightly in the Z-axis direction with respect to the test head 5 or the driver plate of the Z-axis driver 70.

Note that in FIG. 6, the test tray TST is conveyed to between the pushers 30 and the sockets 50 from the orthogonal direction with respect to the paper surface (X-axis). At the time of conveying the test tray TST, the driver plate 72 of the Z-axis driver 70 is elevated along the Z-axis direction, so that a sufficient space for the test tray TST to be carried in is secured between the pushers 30 and the sockets 50.

In the case where ICs to be tested at a time by the test head 5 are 64 ICs arranged 4 lines×16 rows as shown in FIG. 14, for example ICs on 8 rows on every other row are tested at a time. Namely, in the first test, 32 ICs to be tested arranged on every other row from the first row are brought to contact the contact pins 51 of the test head 104 to be tested, and in the second test, the test tray TST is moved by an amount of one row and ICs to be tested arranged on every other row from the second row are tested at a time, so that all ICs to be tested loaded on the test tray TST are tested. The test results are stored at an address determined, for example, by an identification number assigned to the test tray TST and numbers of the ICs assigned inside the test tray.

Unloader Section 400

The unloader section 400 is also provided with X-Y conveyors 404 and 404 having the same configuration with that of the X-Y conveyor 304 provided to the loader section 300. Post-test IC devices are reloaded from the test tray TST conveyed out to the unloader section 400 to a customer tray KST by the X-Y conveyors 404 and 404.

As shown in FIG. 1, an apparatus substrate 105 of the unloader section 400 is provided with two pairs of windows 406 and 406 arranged so that the customer trays KST carried to the unloader section 400 can approach from below.

Further, while not illustrated, an elevator table for elevating or lowering a customer tray KST is provided below the respective openings 406. A customer tray KST becoming full after being reloaded with the post-test IC chips is placed on here and lowered and the full tray is passed to the tray transfer arm 205.

In the electronic device testing apparatus 1 of the present embodiment, although the maximum categories able to be classified is eight kinds, the windows 406 of the unloader 400 can be arranged with four customer trays KST at maximum. Accordingly, categories able to be classified at real time are limited to four kinds. Generally, four categories are sufficient, that is, good ones classified to three categories of high-speed response elements, medium-speed response elements and low-speed response elements, and defective ones added thereto. However, categories which do not belong to these categories sometimes arise, such as those requiring retest, etc.

When arising an IC to be tested to be classified to other than the categories assigned to four customer trays KST arranged at the windows 406 at the unloader section 400, one customer tray is sent back from the unloader section 400 to an IC holder 200 and a customer tray for holding ICs to be tested belonging to the newly arisen category is transferred to the unloader section 400 so as to hold the IC to be tested. Note that when switching customer trays KST in the middle of a classifying operation, the operation has to be suspended during that time, so that there is a disadvantage that the throughput declines. Therefore, in the electronic device testing apparatus 1 of the present embodiment, a buffer portion 405 is provided between the test tray TST and the opening 406 in the unloader section 400 in order to temporarily store ICs to be tested belonging to a rarely arising category.

For example, by securing a capacity able to store 20 to 30 of ICs to be tested in the buffer portion 405 and providing a memory for respectively storing a category of the ICs stored at the respective IC storing position of the buffer portion 405, the category and the position of the ICs to be tested temporarily stored in the buffer portion 405 are stored for each IC to be tested. Then, at an interspace of the classifying operation or at the time the buffer portion 405 becomes full, a customer tray KST of the category the ICs stored in the buffer portion 405 belong is called up from the magazine 200, and the ICs are held on the customer tray. At this time, the ICs temporarily stored in the buffer portion 405 belong to a plurality of categories in some cases, so that a plurality of customer trays KST may be called upon at a time to the window 406 of the unloader section 400 in such cases.

Next, an operation will be explained.

In a test procedure in the chamber section 100, ICs to be tested are transferred above the test head 5 in a state of being loaded on the test tray TST shown in FIG. 5, more specifically, in a state of being dropped into the IC holders 19 of the insert 16 in the same figure.

When the test tray TST stops at the test head 5, the Z-axis driver 70 start to operate, and one pusher 30 shown in FIG. 7 and FIG. 8 is lowered toward one insert 16. Two guide pins 34b and 34b formed on the lower surface of the pusher base 34 penetrate the guide holes 20 and 20, respectively, and fit in the guide bushes 41 and 41 of the socket guide 40.

The above state is shown in FIG. 8, wherein the insert 16 and the pusher 30 have a certain degree of positional error with respect to the socket 50 and the socket guide 40 fixed on the test head 5, however, the guide pin 32 of the pusher base 34 is aligned with the guide hole 20 of the insert 16 and the guide pins 34b of the pusher base 34 inserted to the guide holes 20 of the insert 16 fit in the guide bushes 41 of the socket guide 40 attached to the socket 50. As a result, the pusher block 31 attached to the pusher 30 is able to press the IC to be tested at a suitable position with respect to the X-Y directions.

On the other hand, as to the Z-axis direction, a load on the IC to be tested at the time the stopper guide 34c formed on the pusher base 34 and the stopper surface 42 of the socket guide 40 contact to each other matters. When the load is too large, it leads to breaking of the IC to be tested, while when too small, the test becomes impossible. Accordingly, as shown in FIG. 11, it is necessary that a distance "b" in the Z-axis direction of the stopper guide 34c of the pusher base 34 and the pusher block 31 and a distance "c" in the Z-axis direction of the contact pins 51 and the stopper surface 42 of the socket guide 40 have to be accurately set, however, there is a limit for this, furthermore, a thickness "a" of the IC to be tested itself largely affects, as well.

However, the electronic device testing apparatus of the present embodiment is for unifying pressing forces against ICs to be tested by managing the load imposed by the pusher block 31, and when errors Δa, Δb and Δc arises in the reference sizes "a", "b" and "c", the errors are absorbed while the pusher block 31 gives an elastic force to the ICs due to an action from the springs 36 and 38. Accordingly, it is possible to prevent application of an excessive pressing force to the ICs to be tested nor, inversely, a shortage in pressure force.

Furthermore, a shape, the number of terminals and a terminal shape, etc. vary depending on kinds of ICs to be tested. Thus, it is necessary to change to suitable pushers 30 for a shape, the number of terminals and a terminal shape, etc. of ICs to be tested after changing the kinds of ICs to be tested.

The pusher 30 provided to the electronic device testing apparatus of the embodiments of the present invention is provided with two springs 23 and 38 and able to change elastic forces of the springs 36 and 38 by changing lengths La and Lb of shafts 31a and 31b protruding from the upper surface of the pusher block 31. Accordingly, by preparing respective kinds of pusher blocks 31 having shafts 31a and 31b having lengths of being able to apply a suitable pressing force to respective kinds of ICs to be tested for one match plate attached with components of the pusher 30 excepting the pusher block 31, and changing only the pusher blocks 31 to those corresponding to ICs to be tested after changing the kinds at the time of changing kinds of the ICs, an easy procedure for changing kinds of ICs to be tested can be attained.

Thus, when compared with a method of once detaching all pushers from a match plate, disassembling the respective pushers, changing springs to those having an elastic force able to apply a suitable pressing force to ICs to be tested after changing kinds, and again assembling the pushers to attach to the match plate, a time for changing at the time of changing kinds of ICs to be tested can be widely reduced in a method of only changing pusher blocks 31 in the embodiment of the present invention.

Also, in the pusher 30 of the electronic device testing apparatus according to the embodiment of the present invention, a length Lc of a base portion 31c of the pusher block 31 can be set corresponding to a thickness of an IC to be tested. As a result, suitable stroke management for a thickness of an IC to be tested becomes possible and, even in the case where thicknesses of ICs to be tested differ before and after changing kinds, it can be handled only by changing the pusher blocks 31. Note that even in the case where shapes of upper surfaces of packages of ICs to be tested differ before and after changing kinds, it can be handled by the shape of the lower surface of the base portion 31c of the pusher block 31.

The case will be explained in typical examples. As an example 1, two samples of a pusher as shown in FIG. 8 were produced for ICs to be tested having 132 terminals and requiring a suitable pressing force of 25 gf per unit terminal. Each of the samples of the pusher 30 was produced by using a first spring 36 having the modulus of elasticity of 250 gf/mm and a length of 19 mm and a second spring 38 having the modulus of elasticity of 200 gf/mm and a length of 16.5 mm. Note that a reference length of the produced first spring was 15 mm and that of the produced second spring was 14.4 mm.

Also, the pusher block 31 was produced to be a shape as shown in FIG. 9(A) and to have a length La of first shafts 31a of 7 mm, a length Lb of second shafts 31b of 4.7 mm and a length Lc of a base portion 31c of 7 mm so as to be able to apply a suitable pressing force to an IC to be tested in a state that the springs 36 and 38 are contracted by 0.2 mm at the time of the test. Note that a thickness of the base portion of the load base 32 was 2 mm. When the pusher block 31 is attached to the pusher 30, the first spring 36 is furthermore contracted by 5 mm and the second spring 38 is furthermore contracted by 2.7 mm, so that a pressing force of (19 mm−10 mm)×250 gf/mm=2250 gf is obtained from the first spring 36 and a pressing force of (16.5−11.7 mm)×200 gf/mm=960 gf can be obtained from the second spring 38. As a result, a pressing force of 3210 gf in total is logically obtained at an end of the pusher block 31.

Also, in the state that the stroke is contracted by 0.2 mm at the time of the test, a pressing force of (19 mm−9.8 mm)×250 gf/mm=2300 gf is obtained from the first spring 36 and a pressing force of (16.5-11.5 mm)×200 gf/mm=1000 gf can be obtained from the second spring 38. As a result, a suitable pressing force of 3300 gf in total is logically given to an IC to be tested by the pusher block 31.

Figure 16:
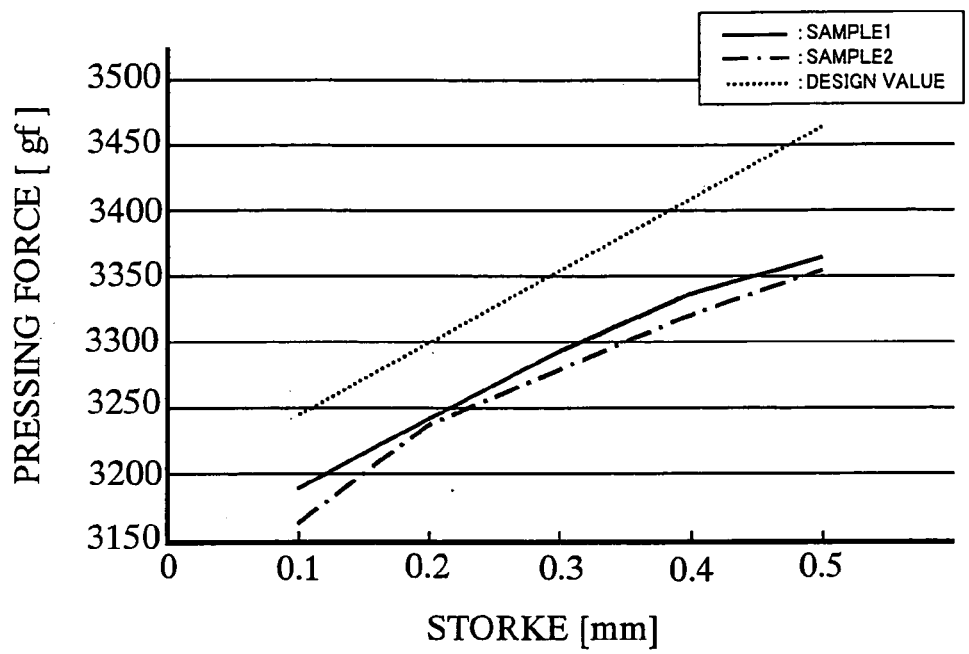
FIG. 16 is a graph of a measurement result of a pressing force of a pusher in an example 1.

When measuring a pressing force of the two samples of the pusher 30, as shown in FIG. 16, in the case of a stroke of 0.2 mm and a design value of 3300 gf (=[132 terminals]×[25 gf per unit terminal]), it became clear that a sample 1 obtained a load of about 3240 gf, a sample 2 obtained a load of about 3240 gf, and a suitable pressing force was applied to the IC to be tested. Note that these measurement values are lower by 60 gf or so than the design value, but when converting to a load per one terminal, it is about 0.45 gf and is a smaller value than the required load of 25 gf, so that it is considered as a sufficiently permitted range.

Also, as an embodiment 2, two samples of a pusher as shown in FIG. 10 were produced for ICs to be tested having 52 terminals and requiring a suitable pressing force of 25 gf per unit terminal. Each of the samples of the pusher 30 was produced in the same way as in the example 1 by using a first spring 36 having the modulus of elasticity of 250 gf/mm and a length of 19 mm and a second spring 38 having the modulus of elasticity of 200 gf/mm and a length of 16.5 mm, and a reference length of the produced first spring was 15 mm and that of the produced second spring was 14.4 mm.

Also the pusher block 31 was produced to be a shape as shown in FIG. 9(C) and to have a length La" of a first shaft 31a of 3.2 mm, a length Lb" of a second shaft 31b of 2 mm and a length Lc" of a base portion 31c of 7 mm so as to be able to apply a suitable pressing force to an IC to be tested in a state that the springs 36 and 38 are contracted by 0.2 mm at the time of the test. When the pusher block 31 is attached to the pusher 30, the first spring 36 is furthermore contracted by 1.2 mm to be 13.8 mm, while the second spring 38 is not contracted because the second shafts 31b does not have a length to penetrate the base portion of the load base 32 and does not contact the second spring 38. Accordingly, an elastic force is not generated by the second spring 38, so that a pressing force of (19 mm−13.8 mm)×250 gf/mm=1300 gf is logically obtained at an end of the pusher block 31 due to an elastic force only of the first spring.

Also, in the state that stroke is contracted by 0.2 mm at the time of the test, a pressing force of (19 mm−13.6 mm)×250 gf/mm=1350 gf is obtained at the end of the pusher block 31 from the first spring 36.

Figure 17:
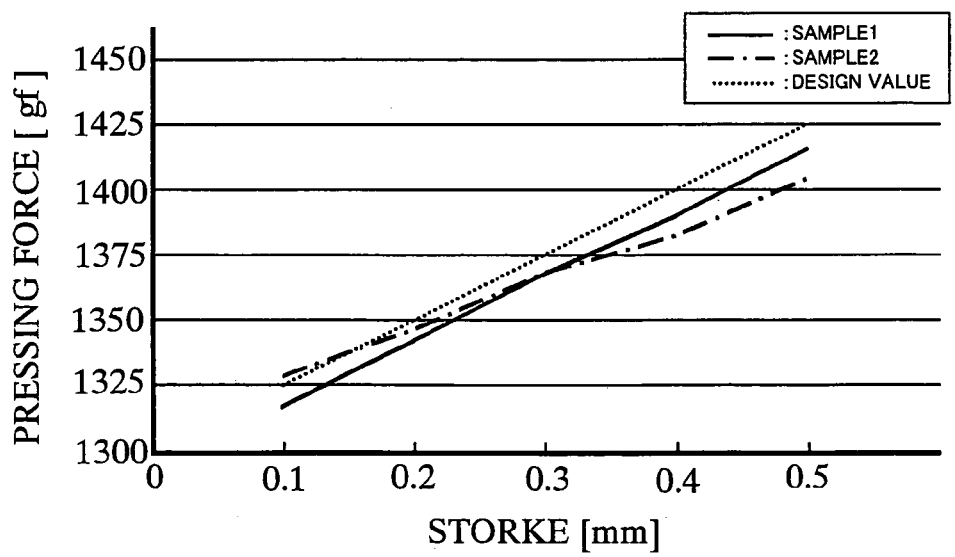
FIG. 17 is a graph of a measurement result of a pressing force of a pusher in an example 2.

When measuring a pressing force of the two samples of the pusher 30, as shown in FIG. 17, in the case of a stroke of 0.2 mm and a design value of 1350 gf (=[54 terminals]×[25 gf per unit terminal]), it was proved that a sample 1 obtained a load of about 1340 gf, a sample 2 obtained a load of about 1345 gf, and a suitable pressing force was applied to the IC to be tested.

Also, as respective components of the pusher 30 excepting the pusher block 31 used in the above examples 1 and 2, those having the same shapes are used, so that it is clear that only by changing the pusher block 31, an easy procedure for changing kinds of ICs to be tested can be attained.

The embodiments explained above are for easier understanding of the present invention and not to limit the present invention. Accordingly, respective elements disclosed in the above embodiments include all modifications in designs and equivalents belonging to the technical field of the present invention.

The invention claimed is:

1. A pusher for applying a suitable pressing force to an electronic device to be tested at the time of conducting a test by pressing input/output terminals of said electronic device to be tested against a socket, comprising:
   a pusher base provided to be able to approach and recede with respect to said socket;
   a lead pusher base fixed to said pusher base;
   a pusher block provided movably to said pusher base for pressing said electronic device to be tested against said socket at the time of said test; and
   two or more elastic means provided between said lead pusher base and said pusher block having an elastic force in the direction of pressing said electronic device to be tested; and
   wherein at least one elastic means among said two or more elastic means applies a press force to said electronic device to be tested via said pusher block at the time of said test.

2. The pusher as set forth in claim 1, wherein said pusher block is detachably provided to said pusher.

3. The pusher as set forth in claim 2, wherein
   a load base attached with said pusher block is further provided;
   said load base and said elastic means are provided between said lead pusher base and said pusher base;
   a part of said pusher block penetrates said load base and contacts at least one of said elastic means; and
   said pusher block is detachably attached to said load base via an opening portion formed on said pusher base.

4. The pusher as set forth in claim 3, wherein:
   said lead pusher base has an opening portion;
   said pusher block is detachably fixed to said load base by a fixing means attached by penetrating said load base; and
   said pusher block is attached/detached as a result that said fixing means is fixed/released via the opening portion of said lead pusher base.

5. The pusher as set forth in claim 4, wherein said fixing means comprise a bolt.

6. The pusher as set forth in claim 3, wherein said elastic means comprise springs having mutually different diameters, and said springs are arranged coaxially about said load base.

7. The pusher as set forth in claim 1, wherein said two or more elastic means include mutually different elastic forces.

8. The pusher as set forth in claim 7, wherein said two or more elastic means include elastic means having mutually different modulus of elasticity.

9. The pusher as set forth in claim 7, wherein said two or more elastic means include an elastic means having mutually different basic lengths.

10. The pusher as set forth in claim 1, wherein:
    said pusher block comprises two or more shafts protruding perpendicularly from an upper surface; and
    said two or more shafts include
       one or more shafts arranged so that each center axis of said one or more shafts coincide with a bottom surface of one elastic means among said two or more elastic means; and
       rest of the shafts arranged so that each center axis of said rest of the shafts coincide with a bottom surfaces of other elastic means among said two or more elastic means.

11. The pusher as set forth in claim 10, wherein said pusher block includes a plurality of kinds of pusher blocks wherein said two or more shafts have respectively different lengths.

12. The pusher as set forth in claim 10, wherein said pusher block includes a plurality of kinds of pusher blocks wherein portions other than said shafts have different lengths in the vertical direction.

13. The pusher as set forth in claim 10, wherein said two or more shafts of said pusher block include:
    said one or more shafts having a length to contact said one of elastic means, and an elastic force of said one of elastic means is given to said pusher block via said one or more shafts; and
    said rest of the shafts having a length to contact said other elastic means, and an elastic force of said other elastic means is given to said pusher block via said rest of the shafts.

14. The pusher as set forth in claim 10, wherein said two or more shafts of said pusher block include:
    said one or more shafts having a length to contact said one of elastic means, and an elastic force of said one of elastic means is given to said pusher block via said one or more shafts; and
    said rest of the shafts having a length not to contact said other elastic means, and an elastic force of said other elastic means is not given to said pusher block.

15. A pusher block attached to a pusher, contacting said electronic device to be tested from an opposite side of said socket at the time of conducting a test by pressing input/output terminals of said electronic device against said socket, comprising
    a shaft protruding perpendicularly from an upper surface, wherein:
    said pusher comprises at least a pusher base provided able to approach and separate with respect to said socket, a lead pusher base fixed to said pusher base, and two or more elastic means provided between said lead pusher base and said pusher block having an elastic force in the direction of pressing said electronic device to be tested;
    said pusher block comprises two or more shafts protruding perpendicularly from an upper surface; and
    said two or more shafts include
       one or more shafts arranged so that each center axis of said one or more shafts coincide with a bottom surface of one elastic means among said two or more elastic means; and
       rest of the shafts arranged so that each center axis of said rest of the shafts coincide with a bottom surfaces of other elastic means among said two or more elastic means.

16. The pusher block as set forth in claim 15, wherein:
    said pusher further comprises a load base attached with said pusher block;
    said load base and said elastic means are provided between said load pusher base and said pusher base;
    at least one of said shafts penetrates said load base and contacts at least one of said elastic means; and
    said pusher block is detachably attached to said load base via an opening formed on said pusher base.

17. The pusher block as set forth in claim 16, wherein:
    said lead pusher base of said pusher has an opening portion;
    said pusher block is detachably fixed to said load base by a fixing means attached by penetrating said load base; and
    said pusher block is attached/detached as a result that said fixing means is fixed/released via the opening portion of said lead pusher base.

18. The pusher block as set forth in claim 17, wherein said fixing means comprise a bolt.

19. The pusher block as set forth in claim 15, wherein said pusher block includes a plurality of kinds of pusher blocks wherein said two or more shafts have respectively different lengths.

20. The pusher block as set forth in claim 15, wherein said pusher block includes a plurality of kinds of pusher blocks wherein portions other than said shafts have different lengths in the vertical direction.

21. The pusher block as set forth in claim 15, wherein said two or more shafts include:
said one or more shafts having a length to contact said one of elastic means; and
said rest of the shafts having a length to contact said other elastic means.

22. The pusher block as set forth in claim 15, wherein said two or more shafts include:
said one or more shafts having a length to contact said one of elastic means of said pusher; and
said rest of the shafts having a length not to contact said other elastic means of said pusher.

23. A pusher for applying a suitable pressing force to an electronic device to be tested at the time of conducting a test by pressing input/output terminals of said electronic device to be tested against a socket, comprising:
a pusher base provided to be able to approach and recede with respect to said socket;
a lead pusher base fixed to said pusher base;
a pusher block provided movably to said pusher base for pressing said electronic device to be tested against said socket at the time of said test;
a load base provided between said lead pusher base and said pusher base; and
at least one elastic means provided between said lead pusher base and said load base having an elastic force in the direction of pressing said electronic device to be tested;
and wherein:
said pusher block is detachably attached to said load base via an opening portion formed on said pusher base,
a part of said pusher block penetrates said load base and contacts said elastic means, and
said elastic means applies a press force to said electronic device to be tested via said pusher block at the time of said test.

24. The pusher as set forth in claim 23, wherein:
said pusher comprises two or more said elastic means,
a part of said pusher block penetrates said load base and contacts at least one of said two or more elastic means, and
at least one of said two or more elastic means applies a press force to said electronic device to be tested via said pusher block at the time of said test.

25. The pusher as set forth in claim 24, wherein:
said pusher block has two or more shafts protruding perpendicularly from an upper surface,
a first shaft included in said two or more shafts faces a first elastic means included in said two or more elastic means, and
a second shaft included in said two or more shafts faces a second elastic means included in said two of more elastic means.

26. A pusher for applying a suitable pressing force to an electronic device to be tested at the time of conducting a test by pressing input/output terminals of said electronic device to be tested against a socket, comprising:
a pusher base provided to be able to approach and recede with respect to said socket;
a pusher block provided movably to said pusher base for pressing said electronic device to be tested against said socket at the time of said test; and
two or more elastic means having an elastic force in the direction of pressing said electronic device to be tested;
and wherein:
said pusher block has two or more shafts protruding perpendicularly from an upper surface,
a first shaft included in said two or more shafts faces a first elastic means included in said two or more elastic means, and
a second shaft included in said two or more shafts faces a second elastic means included in said two of more elastic means.

27. A pusher block attached to a pusher comprising a pusher base provided to be able to approach and recede with respect to said socket; a lead pusher base fixed to said pusher base; a load base provided between said lead pusher base and said pusher base; and two or more elastic means provided between said lead pusher base and said load base having an elastic force in the direction of pressing said electronic device to be tested, wherein:
said pusher block has two or more shafts protruding perpendicularly from an upper surface,
a first shaft included in said two or more shafts faces a first elastic means included in said two or more elastic means,
a second shaft included in said two or more shafts faces a second elastic means included in said two of more elastic means, and
said pusher block is attached to said load base via an opening portion formed on said pusher base.

* * * * *